United States Patent
Heim et al.

(10) Patent No.: US 7,166,953 B2
(45) Date of Patent: Jan. 23, 2007

(54) ELECTROACTIVE POLYMER ROTARY CLUTCH MOTORS

(76) Inventors: Jon Heim, 61 Clarendon Rd., Pacifica, CA (US) 94044; Ronald E. Pelrine, 180 Iroquois Dr., Boulder, CO (US) 80303; Roy D. Kornbluh, 260 Palo Alto Dr., Palo Alto, CA (US) 94301; Joseph Stephen Eckerle, Star Route, Box 20, Redwood City, CA (US) 94025

(*) Notice: Subject to any disclaimer, the term of this patent is extended or adjusted under 35 U.S.C. 154(b) by 865 days.

(21) Appl. No.: 10/090,231

(22) Filed: Feb. 28, 2002

(65) Prior Publication Data

US 2002/0175598 A1 Nov. 28, 2002

Related U.S. Application Data

(60) Provisional application No. 60/273,108, filed on Mar. 2, 2001.

(51) Int. Cl.
*H01L 41/08* (2006.01)

(52) U.S. Cl. ........................................ 310/333; 310/328
(58) Field of Classification Search ................. 310/328, 310/339, 309, 333, 800
See application file for complete search history.

(56) References Cited

U.S. PATENT DOCUMENTS

| | | | |
|---|---|---|---|
| 4,227,347 A | 10/1980 | Tam | |
| 4,236,416 A | 12/1980 | Barcita | |
| 4,240,535 A * | 12/1980 | Pierce et al. | 192/17 C |
| 4,885,783 A | 12/1989 | Whitehead et al. | |
| 5,977,685 A | 11/1999 | Kurita et al. | |
| 6,060,811 A | 5/2000 | Fox et al. | |
| 6,069,420 A * | 5/2000 | Mizzi et al. | 310/328 |
| 6,084,321 A | 7/2000 | Hunter et al. | |
| 6,184,608 B1 | 2/2001 | Cabuz et al. | |
| 6,184,609 B1 | 2/2001 | Johansson et al. | |
| 6,249,076 B1 | 6/2001 | Madden et al. | |
| 6,545,384 B1 * | 4/2003 | Pelrine et al. | 310/800 |
| 6,583,533 B1 * | 6/2003 | Pelrine et al. | 310/309 |

OTHER PUBLICATIONS

Bar–Cohen, Yoseph, JPL, *Worldwide Electroactive Polymers, EAP (Artificial Muscles)Newsletter*, vol. 3, No. 1, Jun. 2001.

Baughman, R.H., L.W. Shacklette, and R.L. Elsenbaumer, E. Plichta, and C. Becht, "Mico electromechanical actuators based on conducting polymers", in Molecular Electronics, Materials and Methods, P.I. Lazarev (ed.), Kluwer Academic Publishers, pp. 267–289 (1991).

Brock, D. L., "Review of Artificial Muscle based on Contractile Polymers," MIT Artificial Intelligence Laboratory, A.I. Memo No. 1330, Nov. 1991.

Caldwell, D., G. Medrano–Cerda, and M. Goodwin, "Characteristics and Adaptive Control of Pneumatic Muscle Actuators for a Robotic Elbow," Proc. IEEE Int. Conference on Robotics and Automation, San Diego, California (May 8–13, 1994).

De Rossi, D., and P. Chiarelli. 1994. "Biomimetic Macromolecular Actuators," *Macro–Ion Characterization, American Chemical Society Symposium Series*, vol. 548, Ch. 40, pp. 517–530.

(Continued)

*Primary Examiner*—Thomas M. Dougherty
*Assistant Examiner*—Karen Addison

(57) ABSTRACT

The present invention relates to mechanical-electrical power conversion systems. The systems comprise one or more electroactive polymers that convert between electrical and mechanical energy. When a voltage is applied to electrodes contacting an electroactive polymer, the polymer deflects. This deflection may be converted into rotation of a power shaft included in a motor. Repeated deflection of the polymer may then produce continuous rotation of the power shaft.

31 Claims, 14 Drawing Sheets

OTHER PUBLICATIONS

Dowling, K., *Beyond Faraday–Non Traditional Actuation*, available on the World Wide Web at http://www.frc.ri.cmu.edu/~nivek/OTH/beyond–faraday/beyondfaraday.html, 9 pages, 1994.

Flynn, Anita M., L.S. Tavrow, S.F. Bart, R.A. Brooks, D.J. Ehrlich, K.R. Udayakumar, and L.E. Cross. 1992. "Piezoelectric Micromotors for Microrobots," *IEEE Journal of Microelectromechanical Systems*, vol. 1, No. 1, pp. 44–51 (Mar. 1992); also published as *MIT Al Laboratory Memo 1269*, Massachusetts Institute of Technology (Feb. 1991).

Hirose, S., Biologically Inspired Robots: Snake–like Locomotors and Manipulators, "*Development of the ACM as a Manipulator*", Oxford University Press, New York, 1993, pp. 170–172.

Jacobsen, S., Price, R., Wood, J, Rytting, T., and Rafaelof, M., "A Design Overview of an Eccentric–Motion Electrostatic Microactuator (the Wobble Motor)", *Sensors and Actuators*, 20 (1989) pp. 1–16.

Kornbluh, R., G. Andeen, and J. Eckerle, "Artificial Muscle: The Next Generation of Robotic Actuators," presented at the Fourth World Conference on Robotics Research, SME Paper M591–331, Pittsburgh, PA, Sep. 17–19, 1991.

Kornbluh, R., Pelrine, R., Eckerie, J., Joseph, J., "Electrostrictive Polymer Artificial Muscle Actuators", IEEE International Conference on Robotics and Automation, Leuven, Belgium, 1998.

Pelrine, R., R. Kornbluh, J. Eckerle "Monolithic Electroactive Polymers" U.S. Appl. No. 09/779,203 filed Feb. 7, 2001.

Kornbluh, R., R. Pelrine, Jose Joseph, Richard Heydt, Qibing Pei, Seiki Chiba, 1999. High–Field Electrostriction of Elastomeric Polymer Dielectrics for Actuation, Proceedings of the SPIE International Symposium on Smart Structures and Materials: Electro–Active Polymer Actuators and Devices, Mar. 1–2, 1999, Newport Beach, California, USA. pp. 149–161.

Kornbluh, R. D and R. E. Pelrine., "Dexterous Multiarticulated Manipulator with Electrostrictive Polymer Artificial Muscle," ITAD–7247–QR–96–175, SRI Project No. 7247, Prepared for: Office of Naval Research, Nov. 1996.

Lang, J, M. Schlect, and R. Howe, "Electric Micromotors: Electromechanical Characteristics," Proc. IEEE Micro Robots and Teleoperators Workshop, Hyannis, Massachusetts (Nov. 9–11, 1987).

Lawless, W. and R. Arenz, "Miniature Solid–state Gas Compressor," *Rev. Sci Instrum.*, 58(8), pp. 1487–1493, Aug. 1987.

Nguyen, T., J. A. Willett and Kornbluh, R., "Robotic systems," in ONR Ocean, Atmosphere, and Space Fiscal Year 1998 Annual Reports (Dec. 1998).

R. Pelrine and Kornbluh, R., and 1995. "*Dexterous Multi-articulated Manipulator with Electrostrictive Polymer Artificial Muscle Actuator*," EMU 95–023, SRI International, Menlo Park, California, Apr. 28, 1995.

Pelrine, R. and Kornbluh, "Electroactive Polymer Devices", U.S. Appl. No. 09/619,846, filed Jul. 20, 2000, 67 pages.

Pelrine et al., "Electroactive Polymer Generators", U.S. Appl. No. 09/619,848, filed Jul. 20, 2000, 69 pages.

Ford, V. and J. Kievet, "*Technical Support Package on Traveling–Wave Rotary Actuators*" NASA Tech Brief vol. 21, No. 10, Item #145, from JPL New Technology Report NPO–19261, Oct. 1997.

Pelrine, R, R. Kornbluh, J. Joseph, and S. Chiba, "Electrostriction of Polymer Films for Microactuators," *Proc. IEEE Tenth Annual International Workshop on Micro Electro Mechanical Systems*, Nagoya, Japan, Jan. 26–30, 1997, pp. 238–243.

Pelrine, R., R. Kornbluh, and J. Eckerle. "Energy Efficient Electroactive Polymers and Electroactive Polymer Devices", U.S. Appl. No. 09/779,373, filed Feb. 7, 2001.

Pelrine, R., and J. Joseph, *FY 1992 Final Report on Artificial Muscle for Small Robots*, ITAD–3393–FR–93–063, SRI International, Menlo Park, California, Mar. 1993.

Pelrine, R., R. Kornbluh, and J. Joseph, FY 1999 *Final Report on Artificial Muscle for Small Robots*, ITAD–10162–FR–00–27, SRI International, Menlo Park, California, 2000.

Pelrine, R., R. Kornbluh, Q. Pei, and J. Joseph, "High Speed Electrically Actuated Elastomers with Over 100% Strain," *Science*, vol. 287, No. 5454, pp. 1–21, 2000.

Pelrine, R., Roy Kornbluh, Jose Joseph, Qibing Pei, Seiki Chiba "Recent Progress in Artificial Muscle Micro Actuators," , SRI International, Tokyo, 1999 MITI/NEEDOIM-NIC, 1999.

Smela, E., O. Inganäs, Q. Pei, and I. Lundström, "Electrochemical Muscles: Micromachining Fingers and Corkscrews, "*Advanced Materials*, vol. 5, No. 9, pp. 630–632, Sep. 1993.

Wax, S. G. and R. R. Sands, "Electroactive Polymer Actuators and Devices," Proceedings of the SPIE International Symposium on Smart Structures and Materials: Electro–Active Polymer Actuators and Devices, Mar. 1–2, 1999, Newport Beach, California, USA., pp. 2–10.

Winters, J., "Muscle as an Actuator for Intelligent Robots", Robotics Research:Trans. Robotics International of SME, Scottsdale, AZ (Aug. 21, 1986).

Roy D. Kornbluh, Robotic Systems, Ocean Engineering and Marine Systems, 2000 Program, Jan. 2001, Office of Naval Research Public Release, ONR–32100–1.

Roy D. Kornbluh, Robotic Systems, Ocean Engineering and Marine Systems, 1999 Program, Feb. 2000, Office of Naval Research Public Release, ONR 32100–2.

Roy D. Kornbluh, Robotic Systems, Ocean Engineering and Marine Systems,1998 Program, Feb. 1999 Office of Naval Research Public Release, ONR 32199–4.

Roy D. Kornbluh, Robotic Systems, Ocean Engineering and Marine Systems 1997 Program, Dec. 1997, Office of Naval Research Public Release, ONR 32198–2.

* cited by examiner

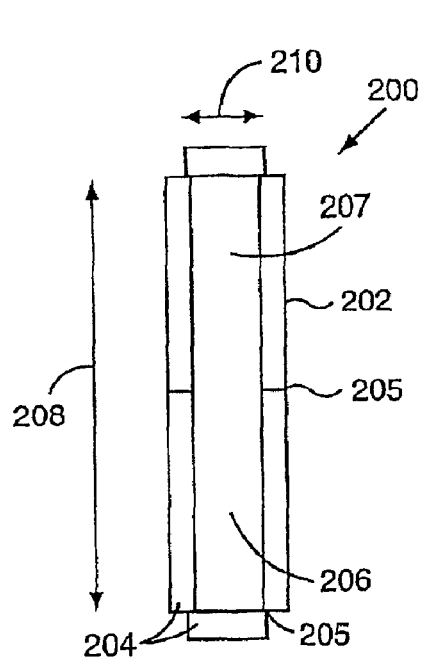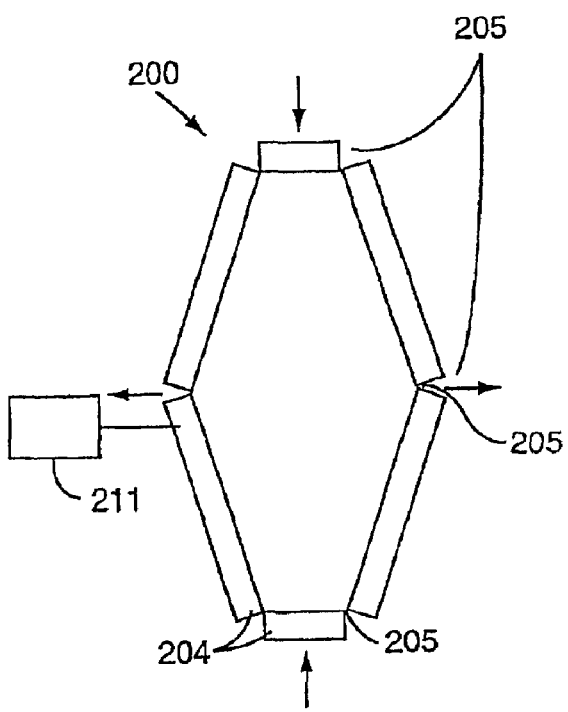
FIG. 2A
FIG. 2B
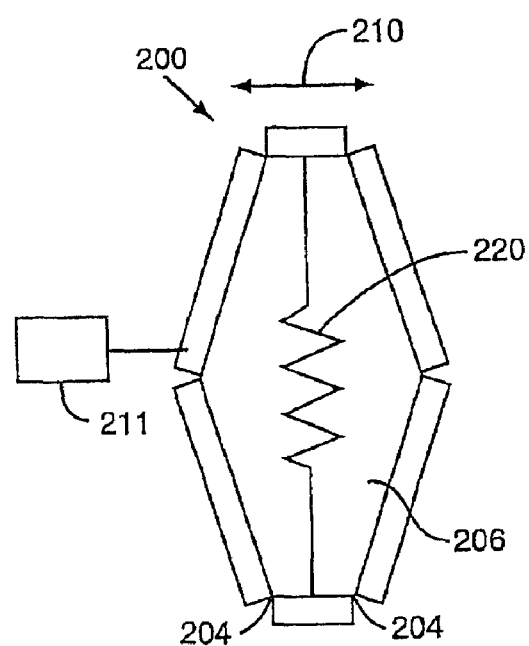
FIG. 2C

ELECTROACTIVE POLYMER ROTARY CLUTCH MOTORS

CROSS-REFERENCE TO RELATED APPLICATION

This application claims priority under 35 U.S.C. §119(e) from now abandoned, U.S. Provisional Patent Application No. 60/273,108, filed Mar. 2, 2001 which is incorporated by reference for all purposes.

BACKGROUND OF THE INVENTION

The present invention relates generally to motors comprising one or more electroactive polymers. More particularly, the present invention relates to clutch motors and their use in various applications.

A motor converts from an input energy to mechanical energy. Most often, the mechanical energy is output as rotary motion of a shaft, but linear motors for translating a shaft are also commonly used. The most common class of input energy for a motor is electricity. Electric motors include AC, DC, servo, and stepper motors. Compressed air and pressurized hydraulic fluid are also used to power air and hydraulic motors. Gasoline or diesel engines are another traditional class of motors that rely on combustion of a fuel. Each of these motor classes has advantages and disadvantages that influence their usage.

For a DC motor, DC current is typically supplied from battery sources. Battery voltages are typically in multiples of 1.5 volts, with 12 volts being the most common. DC motors are made in different electrical configurations, each of which provides a different torque-speed relationship that describes how the motor will respond to an applied load at different speeds. For a permanent magnet DC motor, torque often varies inversely with speed. Since the power available for a DC motor is typically limited, an increase in torque requires a decrease in velocity and vice versa. Thus, when a load is applied, the motor must reduce speed to compensate. One solution to the torque-speed problem is to use a 'speed-controlled DC motor', which contains a controller that increases and decreases current to the motor in the face of changing load to try and maintain a constant speed. These motors are typically expensive and run from an AC source since the controller converts from AC to DC.

AC motors provide continuous rotary motion but usually rely on current supplied by power companies. They are limited to a few speeds that are a function of the AC line frequency, e.g., 60 Hz in the U.S. The most common AC motor no-load speeds are 1725 and 3450 revolutions per minute (rpm), which represent some slippage from the more expensive synchronous AC motors speeds of 1800 and 3600 rpm. If other outputs speeds are desired, a gearbox speed reducer is attached to the motor's output shaft.

AC and DC motors are designed to provide continuous rotary output. Though they can be stalled against a load, they will not tolerate a full voltage, zero velocity stall for an extended period of time without overheating.

Servomotors are fast response, closed loop control motors capable of providing a programmed function of acceleration or velocity, or capable of holding a fixed position against a load. Thus, precise positioning of the output device is possible, as is control of the speed and shape of its time response to changes in load or input commands. However, these devices are very expensive and are commonly used in applications that justify their cost such as moving the flight control services of aircraft.

Stepper motors are designed to position an output device. Unlike servomotors, these are typically open loop, meaning they receive no feedback as to whether the output device has responded as requested. While being relatively good at holding the output in one position for indefinite period, they often are poor with motion and get out of phase with a desired control. In addition, these motors are moderately expensive, have a low torque capacity, and also require special controllers.

Most electromagnetic motors must consume electrical energy to maintain a force or torque. The only exceptions would be motors with preferred magnetic positions such as stepper motors that can resist a torque up to the torque that causes rotor slippage. But even stepper motors cannot provide a constant static torque at an arbitrary rotor position unless power is used. Thus, conventional electromagnetic motors typically use power even to hold a static torque where no external work is done. This is why at stall and low speed conditions the efficiency of almost all electromagnetic motors is poor.

Air and hydraulic motors have more limited application than electric motors since they require the availability of a compressed air or hydraulic source. Both these classes of motors provide poor energy efficiency due to the losses associated with the conversion of energy first from chemical or electrical energy to fluid pressure and then to mechanical output. Although individual air motors and air cylinders are relatively cheap, these pneumatic systems are quite expensive when the cost of all the ancillary equipment is considered.

In addition to the specific drawbacks discussed with respect to each class of motor, all of the above motors classes are generally heavy, bulky and not suitable for many applications such as those requiring light weight continuous output. In view of the foregoing, improved systems that convert from an input energy to mechanical energy would be desirable.

SUMMARY OF THE INVENTION

In one aspect, the present invention relates to a new class of motors and electrical-mechanical power conversion systems. The systems comprise one or more electroactive polymers that convert between electrical and mechanical energy. When a voltage is applied to electrodes contacting an electroactive polymer, the polymer deflects. This deflection may be converted into rotation of a power shaft included in a motor using a clutch. The clutch allows engagement and disengagement between a driving member (an electroactive polymer transducer) and a driven member (a power shaft). Repeated deflection of the polymer may then produce continuous rotation of the power shaft.

Alternatively, when an electroactive polymer deflects, an electric field is produced in the polymer. This electric field may be used to produce electrical energy. Rotation of a power shaft may be used to deflect electroactive polymer. Continuous rotation of the power shaft made then be used to produce continuous electrical energy via the electroactive polymer.

In another aspect, the present invention relates to a mechanical-electrical power conversion system. The system comprises a power shaft configured to rotate about an axis. The system also has a transducer comprising an active area, which includes at least a portion of an electroactive polymer and at least two active area electrodes coupled to the portion of the electroactive polymer. The electroactive polymer includes pre-strain. The system further comprises a clutch for transmitting mechanical energy between the transducer and the power shaft, the clutch operably coupled to the power shaft and the transducer in a manner allowing engagement and disengagement of the power shaft to the transducer.

In yet another aspect, the present invention relates to a mechanical-electrical power conversion system. The system comprises a power shaft configured to rotate about an axis. The system also comprises a first transducer comprising an active area, which includes at least a portion of a first electroactive polymer and at least two active area electrodes coupled to the portion of the first electroactive polymer. The system further comprises a first clutch for transmitting mechanical energy between the first transducer and the power shaft, the first clutch operably coupled to the power shaft and the first transducer in a manner allowing engagement and disengagement of the power shaft to the first transducer. The system additionally comprises a second transducer comprising an active area, which includes at least a portion of a second electroactive polymer and at least two active area electrodes coupled to the portion of the second electroactive polymer. The system also comprises a second clutch for transmitting mechanical energy between the second transducer and the power shaft, the second clutch operably coupled to the power shaft and the second transducer in a manner allowing engagement and disengagement of the power shaft to the second transducer.

In still another aspect, the present invention relates to a mechanical-electrical power conversion system. The system comprises a power shaft configured to rotate about an axis. The system also comprises a transducer comprising an active area, which includes at least a portion of an electroactive polymer and at least two active area electrodes coupled to the portion of the electroactive polymer. The system further comprises a first clutch for transmitting mechanical energy between the transducer and the power shaft, the first clutch operably coupled to the power shaft and the transducer in a manner allowing engagement and disengagement of the power shaft to the transducer, the engagement of the first clutch producing rotation of the power shaft in a first direction about the axis for a first direction of deflection of the transducer. The system additionally comprises a second clutch for transmitting mechanical energy between the transducer and the power shaft, the second clutch operably coupled to the power shaft and the transducer in a manner allowing engagement and disengagement of the power shaft to the transducer, the engagement of the second clutch producing rotation of the power shaft in the first direction about the axis for a second direction of deflection of the transducer.

In another aspect, the present invention relates to a mechanical-electrical power conversion system. The system comprises a power shaft configured to rotate about an axis. The system also comprises a transducer comprising a first active area and a second active area. The first active area has at least two first active area electrodes and a first portion of the electroactive polymer arranged in a manner which causes the first portion to deflect in response to a change in electric field provided by the at least two first active area electrodes. The second active area has at least two second active area electrodes and a second portion of the electroactive polymer arranged in a manner which causes the second portion to deflect in response to a change in electric field provided by the at least two second active area electrodes. The system additionally comprises a clutch for transmitting mechanical energy between the transducer and the power shaft, the clutch operably coupled to the power shaft and the transducer in a manner allowing engagement and disengagement of the power shaft to the transducer.

In yet another aspect, the present invention relates to a device for converting between electrical energy and mechanical energy. The device comprises at least one transducer. Each transducer has at least two electrodes. Each transducer also comprises a polymer arranged in a manner which causes a first portion of the polymer to deflect in the first direction in response to a change in electric field and/or arranged in a manner which causes a change in electric field in response to deflection of the polymer in the first direction. The device further comprises a first substantially rigid member attached to a second portion of the polymer. The device additionally comprises a second substantially rigid member attached to a third portion of the polymer, the second portion and the third portion arranged to increase in distance therebetween upon deflection of the first portion. The device also comprises a first flexure coupled to the first and second members, wherein the first flexure improves torsional stiffness for the device.

These and other features and advantages of the present invention will be described in the following description of the invention and associated figures.

BRIEF DESCRIPTION OF THE DRAWINGS

FIGS. 2A–2C illustrate a linear actuator suitable for use with motors of the present invention.

FIG. 2I illustrates a stretched film actuator suitable for use with motors of the present invention.

DETAILED DESCRIPTION OF THE PREFERRED EMBODIMENTS

Figure 1A:
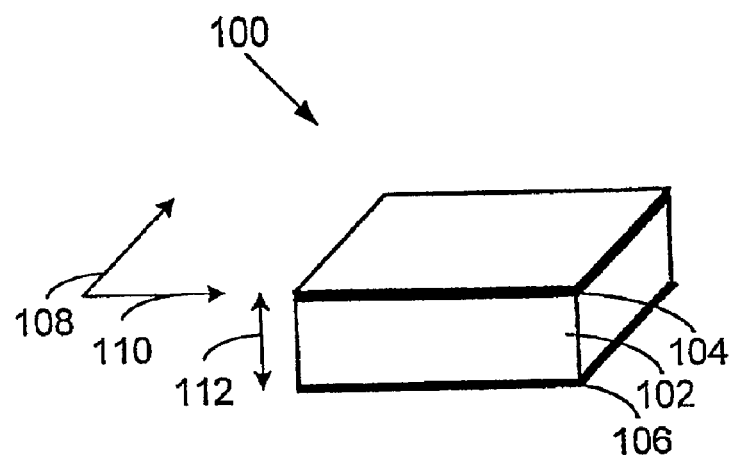
FIGS. 1A and 1B illustrate a top perspective view of a transducer before and after application of a voltage in accordance with one embodiment of the present invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

1. Overview

In one aspect, the present invention relates to continuous output systems that include one or more electroactive polymer transducers. When actuated, a transducer of the present invention produces deflection in one or more directions. Repeated actuation of the transducer may produce reciprocating motion. Reciprocating motion of a transducer may be converted to continuous rotary motion of a power shaft included in a motor using a clutch. When engaged, the clutch transmits deflection and power from an electroactive polymer transducer, a portion thereof, to the power shaft. A motor in accordance with the present invention comprises one or more transducers and clutches configured in a particular motor design. Combining different ways to configure and constrain a polymer within a motor, different ways to arrange active areas on a single or multiple polymers, different motor designs, scalability of electroactive polymers to both micro and macro levels, and different polymer orientations (e.g., rolling or stacking individual polymer layers) permits a broad range of motors that convert electrical energy into mechanical power. These motors find use in a wide range of applications.

For ease of understanding, the present invention is mainly described and shown by focusing on a single direction of energy conversion. More specifically, the present invention focuses on converting electrical energy into mechanical energy. The mechanical energy is most often described herein as continuous rotary output power or rotary output for a number of polymer deflections. However, in all the figures and discussions for the present invention, it is important to note that the polymers and systems may convert between electrical energy and mechanical energy bi-directionally. Thus, any of the electroactive polymer systems and motor designs described herein also convert mechanical energy to electrical energy (generator mode) by oscillating the shaft input though an angle. Typically, a generator of the present invention comprises a polymer arranged in a manner that causes a change in electric field in response to deflection of a portion of the polymer. The change in electric field, along with changes in the polymer dimension in the direction of the field, produces a change in voltage, and hence a change in electrical energy.

For a transducer having a substantially constant thickness, one mechanism for differentiating the performance of the transducer, or a portion of the transducer associated with a single active area, as being an actuator or a generator is in the change in net area orthogonal to the thickness associated with the polymer deflection. For these transducers or active areas, when the deflection causes the net area of the transducer/active area to decrease and there is charge on the electrodes, the transducer/active area is converting from mechanical to electrical energy and acting as a generator. Conversely, when the deflection causes the net area of the transducer/active area to increase and charge is on the electrodes; the transducer/active area is converting electrical to mechanical energy and acting as an actuator. The change in area in both cases corresponds to a reverse change in film thickness, i.e., the thickness contracts when the planar area expands, and the thickness expands when the planar area contracts. Both the change in area and change in thickness affect the amount of energy that is converted between electrical and mechanical. Since the effects due to a change in area and corresponding change in thickness are complementary, only the change in area will be discussed herein for sake of brevity. In addition, although deflection of an electroactive polymer will primarily be discussed as a net increase in area of the polymer when the polymer is being used in an actuator to produce mechanical energy, it is understood that in some cases (i.e. depending on the loading), the net area may decrease to produce mechanical work. Alternatively, when an electroactive polymer is continuously being cycled between actuator and generator modes, electrical or mechanical (elastic) energy may be stored from one part of the cycle for use in other parts of the cycle. This may further introduce situations in which the net area may decrease to produce mechanical work. Thus, devices of the present invention may include both actuator and generator modes, depending on how the polymer is arranged and applied.

2. General Structure of Electroactive Polymers

The transformation between electrical and mechanical energy in devices of the present invention is based on energy conversion of one or more active areas of an electroactive polymer. Electroactive polymers deflect when actuated by electrical energy. To help illustrate the performance of an electroactive polymer in converting electrical energy to mechanical energy, FIG. 1A illustrates a top perspective view of a transducer portion 100 in accordance with one embodiment of the present invention. The transducer portion 100 comprises an electroactive polymer 102 for converting between electrical energy and mechanical energy. In one embodiment, an electroactive polymer refers to a polymer that acts as an insulating dielectric between two electrodes and may deflect upon application of a voltage difference between the two electrodes. Top and bottom electrodes 104 and 106 are attached to the electroactive polymer 102 on its top and bottom surfaces, respectively, to provide a voltage difference across a portion of the polymer 102. Polymer 102 deflects with a change in electric field provided by the top and bottom electrodes 104 and 106. Deflection of the transducer portion 100 in response to a change in electric field provided by the electrodes 104 and 106 is referred to as actuation. As polymer 102 changes in size, the deflection may be used to produce mechanical work.

Figure 1B:
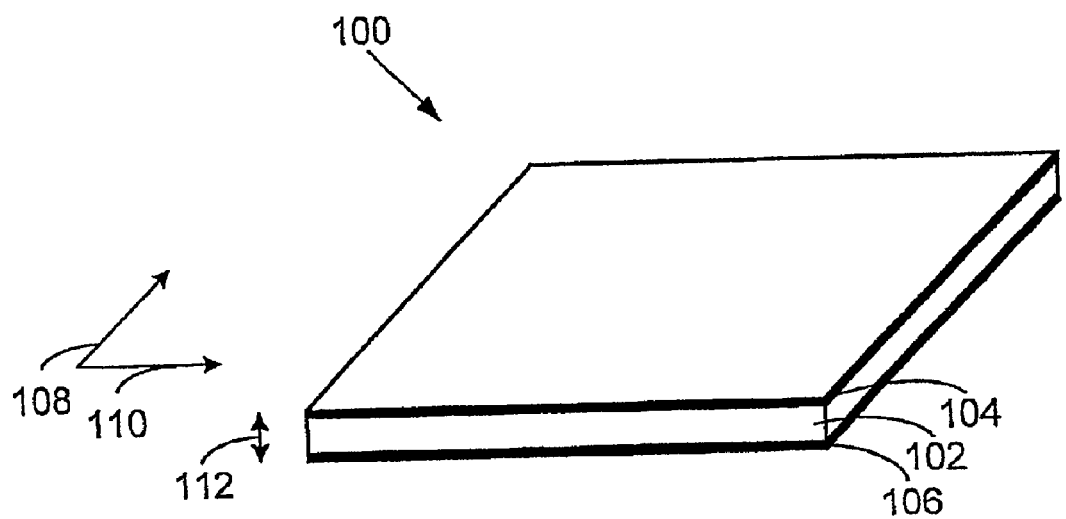

FIG. 1B illustrates a top perspective view of the transducer portion 100 including deflection in response to a change in electric field. In general, deflection refers to any displacement, expansion, contraction, torsion, linear or area strain, or any other deformation of a portion of the polymer 102. The change in electric field corresponding to the voltage difference applied to or by the electrodes 104 and 106 produces mechanical pressure within polymer 102. In this case, the unlike electrical charges produced by electrodes 104 and 106 attract each other and provide a compressive force between electrodes 104 and 106 and an expansion force on polymer 102 in planar directions 108 and 110, causing polymer 102 to compress between electrodes 104 and 106 and stretch in the planar directions 108 and 110.

In some cases, electrodes 104 and 106 cover a limited portion of polymer 102 relative to the total area of the polymer. This may be done to prevent electrical breakdown around the edge of polymer 102 or to achieve customized deflections for one or more portions of the polymer. As the term is used herein, an active area is defined as a portion of a transducer comprising polymer material 102 and at least two electrodes. When the active area is used to convert electrical energy to mechanical energy, the active area includes a portion of polymer 102 having sufficient electrostatic force to enable deflection of the portion. When the active area is used to convert mechanical energy to electrical energy, the active area includes a portion of polymer 102 having sufficient deflection to enable a change in electrostatic energy. As will be described below, a polymer of the present invention may have multiple active areas. In some cases, polymer 102 material outside an active area may act as an external spring force on the active area during deflection. More specifically, polymer material outside the active area may resist active area deflection by its elastic contraction or expansion. Removal of the voltage difference and the induced charge causes the reverse effects.

Electrodes 104 and 106 are compliant and change shape with polymer 102. The configuration of polymer 102 and electrodes 104 and 106 provides for increasing polymer 102 response with deflection. More specifically, as the transducer portion 100 deflects, compression of polymer 102 brings the opposite charges of electrodes 104 and 106 closer and the stretching of polymer 102 separates similar charges in each electrode. In one embodiment, one of the electrodes 104 and 106 is ground.

In general, the transducer portion 100 continues to deflect until mechanical forces balance the electrostatic forces driving the deflection. The mechanical forces include elastic restoring forces of the polymer 102 material, the compliance of electrodes 104 and 106, and any external resistance provided by a device and/or load coupled to the transducer portion 100, etc. The deflection of the transducer portion 100 as a result of the applied voltage may also depend on a number of other factors such as the polymer 102 dielectric constant and the size of polymer 102.

Electroactive polymers in accordance with the present invention are capable of deflection in any direction. After application of the voltage between the electrodes 104 and 106, the electroactive polymer 102 increases in size in both planar directions 108 and 110. In some cases, the electroactive polymer 102 is incompressible, e.g. has a substantially constant volume under stress. In this case, the polymer 102 decreases in thickness as a result of the expansion in the planar directions 108 and 110. It should be noted that the present invention is not limited to incompressible polymers and deflection of the polymer 102 may not conform to such a simple relationship.

Application of a relatively large voltage difference between electrodes 104 and 106 on the transducer portion 100 shown in FIG. 1A will cause transducer portion 100 to change to a thinner, larger area shape as shown in FIG. 1B. In this manner, the transducer portion 100 converts electrical energy to mechanical energy. The transducer portion 100 may also be used to convert mechanical energy to electrical energy.

FIGS. 1A and 1B may be used to show one manner in which the transducer portion 100 converts mechanical energy to electrical energy. For example, if the transducer portion 100 is mechanically stretched by external forces to a thinner, larger area shape such as that shown in FIG. 1B, and a relatively small voltage difference (less than that necessary to actuate the film to the configuration in FIG. 1B) is applied between electrodes 104 and 106, the transducer portion 100 will contract in area between the electrodes to a shape such as in FIG. 1A when the external forces are removed. Stretching the transducer refers to deflecting the transducer from its original resting position—typically to result in a larger net area between the electrodes, e.g. in the plane defined by directions 108 and 110 between the electrodes. The resting position refers to the position of the transducer portion 100 having no external electrical or mechanical input and may comprise any pre-strain in the polymer. Once the transducer portion 100 is stretched, the relatively small voltage difference is provided such that the resulting electrostatic forces are insufficient to balance the elastic restoring forces of the stretch. When the external forces are removed, the transducer portion 100 therefore contracts, and it becomes thicker and has a smaller planar area in the plane defined by directions 108 and 110 (orthogonal to the thickness between electrodes). When polymer 102 becomes thicker, it separates electrodes 104 and 106 and their corresponding unlike charges, thus raising the electrical energy and voltage of the charge. Further, when electrodes 104 and 106 contract to a smaller area, like charges within each electrode compress, also raising the electrical energy and voltage of the charge. Thus, with different charges on electrodes 104 and 106, contraction from a shape such as that shown in FIG. 1B to one such as that shown in FIG. 1A raises the electrical energy of the charge. That is, mechanical deflection is being turned into electrical energy and the transducer portion 100 is acting as a generator.

In some cases, the transducer portion 100 may be described electrically as a variable capacitor. The capacitance decreases for the shape change going from that shown in FIG. 1B to that shown in FIG. 1A. Typically, the voltage difference between electrodes 104 and 106 will be raised by contraction. This is normally the case, for example, if additional charge is not added or subtracted from electrodes 104 and 106 during the contraction process. The increase in electrical energy, U, may be illustrated by the formula $U=0.5\ Q^2/C$, where Q is the amount of positive charge on the positive electrode and C is the variable capacitance which relates to the intrinsic dielectric properties of polymer 102 and its geometry. If Q is fixed and C decreases, then the electrical energy U increases. The increase in electrical energy and voltage can be recovered or used in a suitable device or electronic circuit in electrical communication with electrodes 104 and 106. In addition, the transducer portion 100 may be mechanically coupled to a mechanical input that deflects the polymer and provides mechanical energy.

The transducer portion 100 will convert mechanical energy to electrical energy when it contracts. Some or all of the charge and energy can be removed when the transducer portion 100 is fully contracted in the plane defined by directions 108 and 110. Alternatively, some or all of the charge and energy can be removed during contraction. If the electric field pressure in the polymer increases and reaches balance with the mechanical elastic restoring forces and external load during contraction, the contraction will stop before full contraction, and no further elastic mechanical energy will be converted to electrical energy. Removing some of the charge and stored electrical energy reduces the electrical field pressure, thereby allowing contraction to continue. Thus, removing some of the charge may further convert mechanical energy to electrical energy. The exact electrical behavior of the transducer portion 100 when operating as a generator depends on any electrical and mechanical loading as well as the intrinsic properties of polymer 102 and electrodes 104 and 106.

In one embodiment, electroactive polymer 102 is pre-strained. Pre-strain of a polymer may be described, in one or more directions, as the change in dimension in a direction after pre-straining relative to the dimension in that direction before pre-straining. The pre-strain may comprise elastic deformation of polymer 102 and be formed, for example, by stretching the polymer in tension and fixing one or more of the edges while stretched. For many polymers, pre-strain improves conversion between electrical and mechanical energy. The improved mechanical response enables greater mechanical work for an electroactive polymer, e.g., larger deflections and actuation pressures. In one embodiment, prestrain improves the dielectric strength of the polymer. In another embodiment, the pre-strain is elastic. After actuation, an elastically pre-strained polymer could, in principle, be unfixed and return to its original state. The pre-strain may be imposed at the boundaries using a rigid frame or may also be implemented locally for a portion of the polymer.

In one embodiment, pre-strain is applied uniformly over a portion of polymer 102 to produce an isotropic pre-strained polymer. For example, an acrylic elastomeric polymer may be stretched by 200 to 400 percent in both planar directions. In another embodiment, pre-strain is applied unequally in different directions for a portion of polymer 102 to produce an anisotropic pre-strained polymer. In this case, polymer 102 may deflect greater in one direction than another when actuated. While not wishing to be bound by theory, it is believed that pre-straining a polymer in one direction may increase the stiffness of the polymer in the pre-strain direction. Correspondingly, the polymer is relatively stiffer in the high pre-strain direction and more compliant in the low pre-strain direction and, upon actuation, more deflection occurs in the low pre-strain direction. In one embodiment, the deflection in direction 108 of transducer portion 100 can be enhanced by exploiting large pre-strain in the perpendicular direction 110. For example, an acrylic elastomeric polymer used as the transducer portion 100 may be stretched by 100 percent in direction 108 and by 500 percent in the perpendicular direction 110. The quantity of pre-strain for a polymer may be based on the polymer material and the desired performance of the polymer in an application. Pre-strain suitable for use with the present invention is further described in copending U.S. patent application Ser. No. 09/619,848, which is incorporated by reference for all purposes.

Generally, after the polymer is pre-strained, it may be fixed to one or more objects. Each object is preferably suitably stiff to maintain the level of pre-strain desired in the polymer. The polymer may be fixed to the one or more objects according to any conventional method known in the such as a chemical adhesive, an adhesive layer or material, mechanical attachment, etc.

Transducers and pre-strained polymers of the present invention are not limited to any particular geometry or type of deflection. For example, the polymer and electrodes may be formed into any geometry or shape including tubes and rolls, stretched polymers attached between multiple rigid structures, stretched polymers attached across a frame of any geometry—including curved or complex geometries, across a frame having one or more joints, etc. Deflection of a transducer according to the present invention includes linear expansion and compression in one or more directions, bending, axial deflection when the polymer is rolled, deflection out of a hole provided on a substrate, etc. Deflection of a transducer may be affected by how the polymer is constrained by a frame or rigid structures attached to the polymer. In one embodiment, a flexible material that is stiffer in elongation than the polymer is attached to one side of a transducer to induce bending when the polymer is actuated.

Materials suitable for use as a pre-strained polymer with the present invention may include any substantially insulating polymer or rubber (or combination thereof) that deforms in response to an electrostatic force or whose deformation results in a change in electric field. One suitable material is NuSil CF19-2186 as provided by NuSil Technology of Carpenteria, Calif. Other exemplary materials suitable for use as a pre-strained polymer include silicone elastomers, acrylic elastomers such as VHB 4910 acrylic elastomer as produced by 3M Corporation of St. Paul, Minn., polyurethanes, thermoplastic elastomers, copolymers comprising PVDF, pressure-sensitive adhesives, fluoroelastomers, polymers comprising silicone and acrylic moieties, and the like. Polymers comprising silicone and acrylic moieties may include copolymers comprising silicone and acrylic moieties, polymer blends comprising a silicone elastomer and an acrylic elastomer, for example. Combinations of some of these materials may also be used as the electroactive polymer in transducers of this invention.

An electroactive polymer layer in transducers of the present invention may have a wide range of thicknesses. In one embodiment, polymer thickness may range between about 1 micrometer and 2 millimeters. Polymer thickness may be reduced by stretching the film in one or both planar directions. In many cases, electroactive polymers of the present invention may be fabricated and implemented as thin films. Thicknesses suitable for these thin films may be below 50 micrometers.

Although the discussion so far has focused primarily on one type of electroactive polymer commonly referred to as dielectric elastomers (transducer 100 of FIG. 1A), motors of the present invention may also incorporate other conventional electroactive polymers. As the term is used herein, an electroactive polymer refers to a polymer that responds to electrical stimulation. Other common classes of electroactive polymer suitable for use with many embodiments of the present invention include electrostrictive polymers, electronic electroactive polymers, and ionic electroactive polymers, and some copolymers. Electrostrictive polymers are characterized by the non-linear reaction of a electroactive polymers (relating strain to $E^2$). Electronic electroactive polymers typically change shape or dimensions due to migration of electrons in response to electric field (usually dry). Ionic electroactive polymers are polymers that change shape or dimensions due to migration of ions in response to electric field (usually wet and contains electrolyte). Irradiated copolymer of polyvinylidene difluoride and trifluoroethelene P(VDF-TrFE) is an electroactive polymer suitable for use with some embodiments of the present invention.

Suitable actuation voltages for electroactive polymers, or portions thereof, may vary based on the material properties of the electroactive polymer, such as the dielectric constant, as well as the dimensions of the polymer, such as the thickness of the polymer film. For example, actuation electric fields used to actuate polymer 102 in FIG. 1A may range in magnitude from about 0 V/m to about 440 MV/m. Actuation electric fields in this range may produce a pressure in the range of about 0 Pa to about 10 MPa. In order for the transducer to produce greater forces, the thickness of the polymer layer may be increased. Actuation voltages for a particular polymer may be reduced by increasing the dielectric constant, decreasing the polymer thickness, and decreasing the modulus of elasticity, for example.

As electroactive polymers of the present invention may deflect at high strains, electrodes attached to the polymers should also deflect without compromising mechanical or electrical performance. Generally, electrodes suitable for use with the present invention may be of any shape and material provided that they are able to supply a suitable voltage to, or receive a suitable voltage from, an electroactive polymer. The voltage may be either constant or varying over time. In one embodiment, the electrodes adhere to a surface of the polymer. Electrodes adhering to the polymer are preferably compliant and conform to the changing shape of the polymer. Correspondingly, the present invention may include compliant electrodes that conform to the shape of an electroactive polymer to which they are attached. The electrodes may be only applied to a portion of an electroactive polymer and define an active area according to their geometry. Several examples of electrodes that only cover a portion of an electroactive polymer will be described in further detail below.

Various types of electrodes suitable for use with the present invention are described in copending U.S. patent application Ser. No. 09/619,848, which was previously incorporated by reference above. Electrodes described therein and suitable for use with the present invention include structured electrodes comprising metal traces and charge distribution layers, textured electrodes comprising varying out of plane dimensions, conductive greases such as carbon greases or silver greases, colloidal suspensions, high aspect ratio conductive materials such as carbon fibrils and carbon nanotubes, and mixtures of ionically conductive materials.

Materials used for electrodes of the present invention may vary. Suitable materials used in an electrode may include graphite, carbon black, colloidal suspensions, thin metals including silver and gold, silver filled and carbon filled gels and polymers, and ionically or electrically conductive polymers. In a specific embodiment, an electrode suitable for use with the present invention comprises 80 percent carbon grease and 20 percent carbon black in a silicone rubber binder such as Stockwell RTV60-CON as produced by Stockwell Rubber Co. Inc. of Philadelphia, Pa. The carbon grease is of the type such as NyoGel 756G as provided by Nye Lubricant Inc. of Fairhaven, Mass. The conductive grease may also be mixed with an elastomer, such as silicon elastomer RTV 118 as produced by General Electric of Waterford, N.Y., to provide a gel-like conductive grease.

It is understood that certain electrode materials may work well with particular polymers and may not work as well for others. For example, carbon fibrils work well with acrylic elastomer polymers while not as well with silicone polymers. For most transducers, desirable properties for the compliant electrode may include one or more of the following: low modulus of elasticity, low mechanical damping, low surface resistivity, uniform resistivity, chemical and environmental stability, chemical compatibility with the electroactive polymer, good adherence to the electroactive polymer, and the ability to form smooth surfaces. In some cases, a transducer of the present invention may implement two different types of electrodes, e.g. a different electrode type for each active area or different electrode types on opposing sides of a polymer.

Electronic drivers are typically connected to the electrodes. The voltage provided to electroactive polymer will depend upon specifics of an application. In one embodiment, a transducer of the present invention is driven electrically by modulating an applied voltage about a DC bias voltage. Modulation about a bias voltage allows for improved sensitivity and linearity of the transducer to the applied voltage. For example, a transducer used in an audio application may be driven by a signal of up to 200 to 1000 volts peak to peak on top of a bias voltage ranging from about 750 to 2000 volts DC.

3. Multiple Active Areas

In accordance with the present invention, the term "monolithic" is used herein to refer to electroactive polymers, transducers, and devices comprising a plurality of active areas.

Figure 1C:
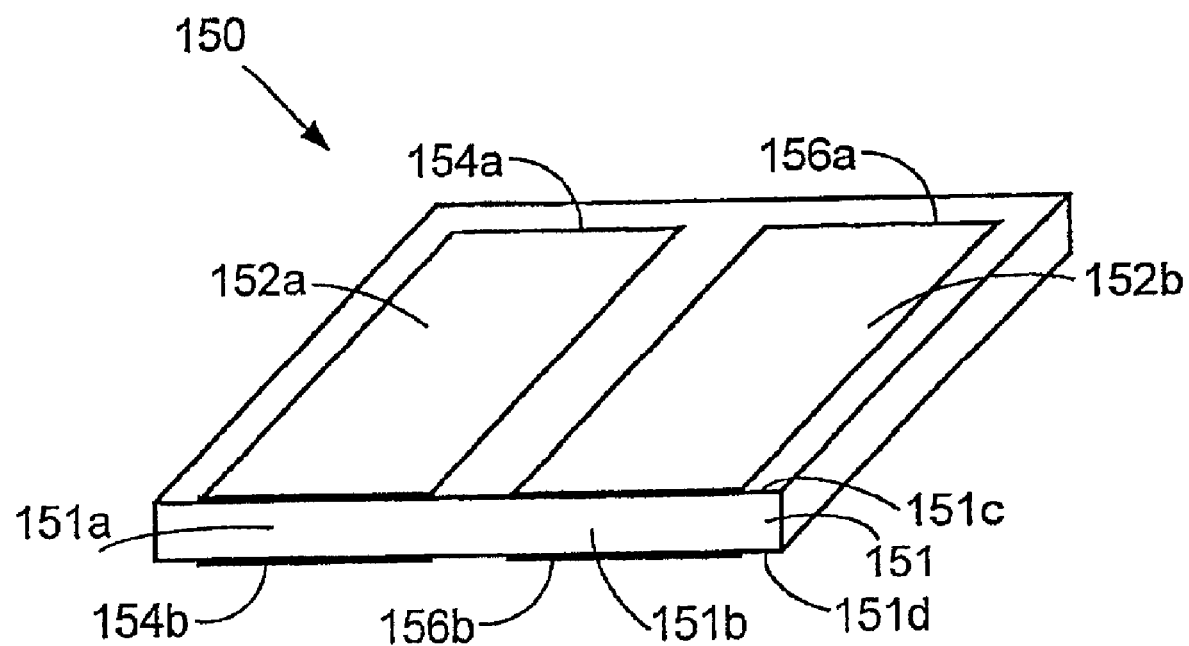
FIG. 1C illustrates a monolithic transducer comprising a plurality of active areas in accordance with one embodiment of the present invention.

FIG. 1C illustrates a monolithic transducer 150 comprising a plurality of active areas in accordance with one embodiment of the present invention. The monolithic transducer 150 converts between electrical energy and mechanical energy. The monolithic transducer 150 comprises an electroactive polymer 151 including two active areas 152*a* and 152*b*. The polymer 151 can be held using, for example, a rigid frame (not shown) attached at the edges of the polymer 151.

The active area 152*a* has top and bottom electrodes 154*a* and 154*b* attached to the polymer 151 on its top and bottom surfaces 151*c* and 151*d*, respectively. The electrodes 154*a* and 154*b* provide a voltage difference across a portion 151*a* of the polymer 151. The portion 151*a* deflects with a change in electric field provided by the electrodes 154*a* and 154*b*. The portion 151*a* comprises the polymer 151 between the electrodes 154*a* and 154*b* and any other portions of the polymer 151 having sufficient electrostatic force to enable deflection upon application of voltages using the electrodes 154*a* and 154*b*. When the device 150 is used as a generator to convert from electrical energy to mechanical energy, deflection of the portion 151*a* causes a change in electric field in the portion 151*a* that is received as a change in voltage difference by the electrodes 154*a* and 154*b*.

The active area 152*b* has top and bottom electrodes 156*a* and 156*b* attached to the polymer 151 on its top and bottom surfaces 151*c* and 151*d*, respectively. The electrodes 156*a* and 156*b* provide a voltage difference across a portion 151*b* of the polymer 151. The portion 151*b* deflects with a change in electric field provided by the electrodes 156*a* and 156*b*. The portion 151*b* comprises the polymer 151 between the electrodes 156*a* and 156*b* and any other portions of the polymer 151 having sufficient stress induced by the electrostatic force to enable deflection upon application of voltages using the electrodes 156*a* and 156*b*. When the device 150 is used as a generator to convert from electrical energy to mechanical energy, deflection of the portion 151*b* causes a change in electric field in the portion 151*b* that is received as a change in voltage difference by the electrodes 156*a* and 156*b*.

The active areas for monolithic polymers and transducers of the present invention may be flexibly arranged. In one embodiment, active areas in a polymer are arranged such that elasticity of the active areas is balanced. In another embodiment, a transducer of the present invention includes a plurality of symmetrically arranged active areas. Further description of monolithic transducers suitable for use with the present invention are further described in commonly owned U.S. patent application Ser. No. 09/779,203, which is incorporated by reference herein for all purposes.

4. Actuator Designs

The deflection of an electroactive polymer can be used in a variety of ways to produce or receive mechanical energy. One common implementation of a transducer in a motor is within an actuator. Several exemplary actuators suitable for use with motors of the present invention will now be discussed.

Expansion in one direction of an electroactive polymer may induce contractile stresses in a second direction such as due to Poisson effects. This may reduce the mechanical output for a transducer that provides mechanical output in the second direction. Correspondingly, actuators used in motors of the present invention may be designed to constrain a polymer in the non-output direction. In some cases, actuators may be designed to improve mechanical output using deflection in the non-output direction.

An actuator that uses deflection in one planar direction to improve energy conversion in the other planar direction is a bow actuator. FIGS. 2A and 2B illustrate a bow actuator 200 suitable for use with motors of the present invention. The bow actuator 200 is a planar mechanism comprising a flexible frame 202 which provides mechanical assistance to improve conversion from electrical energy to mechanical energy for a polymer 206 attached to the frame 202. The frame 202 includes six rigid members 204 connected at joints 205. The members 204 and joints 205 provide mechanical assistance by coupling polymer deflection in a planar direction 208 into mechanical output in a perpendicular planar direction 210. More specifically, the frame 202 is arranged such that a small deflection of the polymer 206 in the direction 208 improves displacement in the perpendicular planar direction 210. Attached to opposing (top and bottom) surfaces of the polymer 206 are electrodes 207 (bottom electrode on bottom side of polymer 206 not shown) to provide a voltage difference across a portion of the polymer 206.

The polymer 206 is configured with different levels of pre-strain in its orthogonal directions. More specifically, electroactive polymer 206 includes a high pre-strain in the planar direction 208, and little or no pre-strain in the perpendicular planar direction 210. This anisotropic pre-strain is arranged relative to the geometry of the frame 202. More specifically, upon actuation using electrodes 207, the polymer contracts in the high pre-strained direction 208. With the restricted motion of the frame 202 and the lever arm provided by the members 204, this contraction helps drive deflection in the perpendicular planar direction 210. Thus, even for a short deflection of the polymer 206 in the high pre-strain direction 208, the frame 202 bows outward in the direction 210. In this manner, a small contraction in the high pre-strain direction 210 becomes a larger expansion in the relatively low pre-strain direction 208.

Using the anisotropic pre-strain and constraint provided by the frame 202, the bow actuator 200 allows contraction in one direction to enhance mechanical deflection and electrical to mechanical conversion in another. In other words, a load 211 (FIG. 2B) attached to the bow actuator 200 is coupled to deflection of the polymer 206 in two directions—direction 208 and 210. Thus, as a result of the differential pre-strain of the polymer 206 and the geometry of the frame 202, the bow actuator 200 is able to provide a larger mechanical displacement and mechanical energy output than an electroactive polymer alone for common electrical input.

The pre-strain in the polymer 206 and constraint provided by the frame 202 may also allow the bow actuator 200 to use lower actuation voltages for the pre-strained polymer 206 for a given deflection. As the bow actuator 200 has a lower effective modulus of elasticity in the low pre-strained direction 210, the mechanical constraint provided by the frame 202 allows the bow actuator 200 to be actuated in the direction 210 to a larger deflection with a lower voltage. In addition, the high pre-strain in the direction 208 increases the breakdown strength of the polymer 206, permitting higher voltages and higher deflections for the bow actuator 200.

In one embodiment, the bow actuator 200 may include additional components to provide mechanical assistance and enhance deflection. By way of example, springs 220 as shown in FIG. 2C may be attached to the bow actuator 200 to enhance deflection in the direction 210. The springs load the bow actuator 200 such that the spring force exerted by the springs 220 opposes resistance provided by an external load. In some cases, the springs 220 provide increasing assistance for bow actuator 200 deflection. In addition, pre-strain may be increased to enhance deflection. The load may also be coupled to the rigid members 204 on top and bottom of the frame 202 rather than on the rigid members of the side of the frame 202 (as shown in FIG. 2B).

The shape and constraint of an electroactive polymer may affect deflection. An aspect ratio for an electroactive polymer is defined as the ratio of its length to width. If the aspect ratio is high (e.g., an aspect ratio of at least about 4:1) and the polymer is constrained along its length by rigid members, than the combination may result in a substantially one-dimensional deflection in the width direction.

Figure 2D:
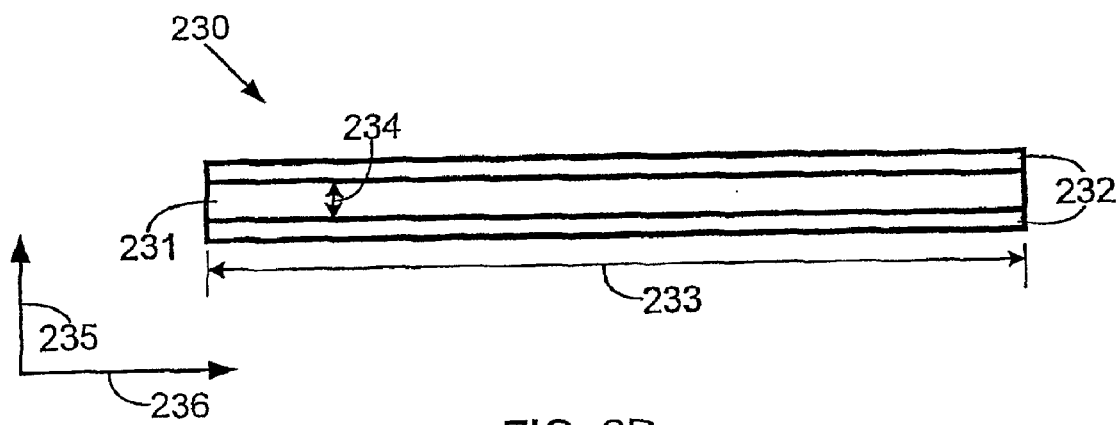
FIGS. 2D and 2E illustrate a linear actuator suitable for use with motors of the present invention.
Figure 2E:
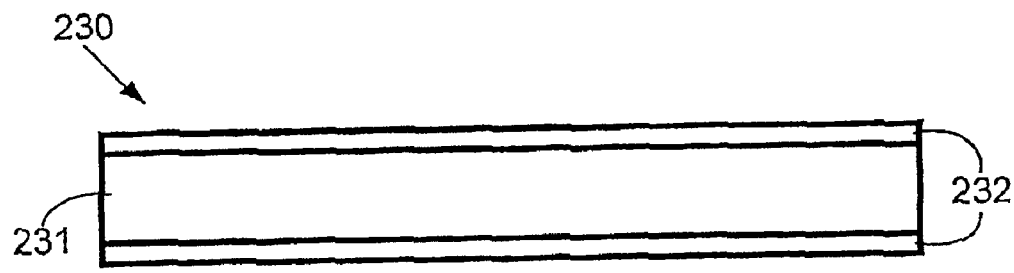

FIGS. 2D and 2E illustrate a linear motion actuator 230 suitable for use with motors of the present invention. Linear motion actuator 230 is a planar mechanism having mechanical deflection in one direction. Linear motion actuator 230 comprises a polymer 231 having a length 233 substantially greater than its width 234 (e.g., an aspect ratio at least about 4:1). Polymer 231 is attached on opposite sides to stiff members 232 of a frame along its length 233. Stiff members 232 have a greater stiffness than the polymer 231. The geometric edge constraint provided by stiff members 232 substantially prevents displacement in a direction 236 along the polymer length 233 and facilitates deflection almost exclusively in a direction 235. When the linear motion actuator 230 is implemented with a polymer 231 having anisotropic pre-strain, such as a higher pre-strain in the direction 236 than in the direction 235, then the polymer 231 is stiffer in the direction 236 than in the direction 235 and large deflections in the direction 235 may result.

A collection of electroactive polymers or actuators may be mechanically linked to form a larger actuator with a common output, e.g. force and/or displacement. By using a small electroactive polymer as a base unit in a collection, conversion of electric energy to mechanical energy may be scaled according to an application. By way of example, multiple linear motion actuators 230 may be combined in series in the direction 235 to form an actuator having a cumulative deflection of all the linear motion actuators in the series.

Figure 2F:
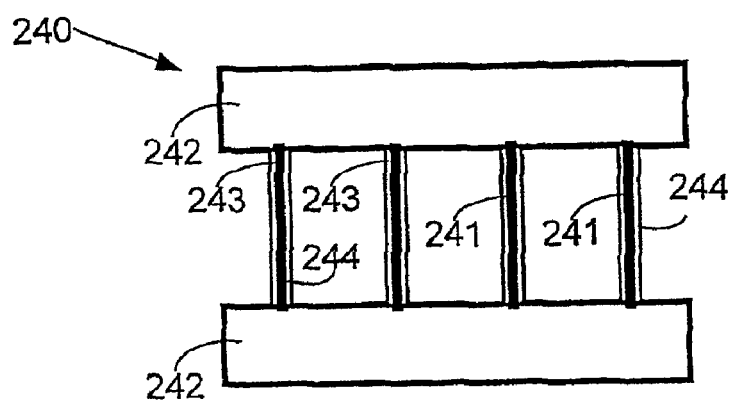
FIG. 2F illustrates cross-sectional side view of a multilayer actuator for converting from electrical energy to mechanical energy.

FIG. 2F illustrates cross-sectional side view of a multilayer actuator 240 for converting from electrical energy to mechanical energy. The multilayer actuator 240 includes four pre-strained polymers 241 arranged in parallel and each attached to a rigid frame 242 such that they have the same deflection. Electrodes 243 and 244 are deposited on opposite surfaces of each polymer 241 and provide simultaneous electrostatic actuation to the four pre-strained polymers 241. The multilayer actuator 240 provides cumulative force output of the individual polymer layers 241.

An electroactive polymer is typically compliant and does not provide a large stiffness, e.g., relative to a solid structure. Many mechanical applications require an electroactive polymer actuator having stiffness in all directions but the direction of actuation. Rigid members may be included in a device and provide stiffness in one or more directions. However, these stiff members may constrain deflection of the polymer and are typically not used in the direction of output motion.

Figure 2G:
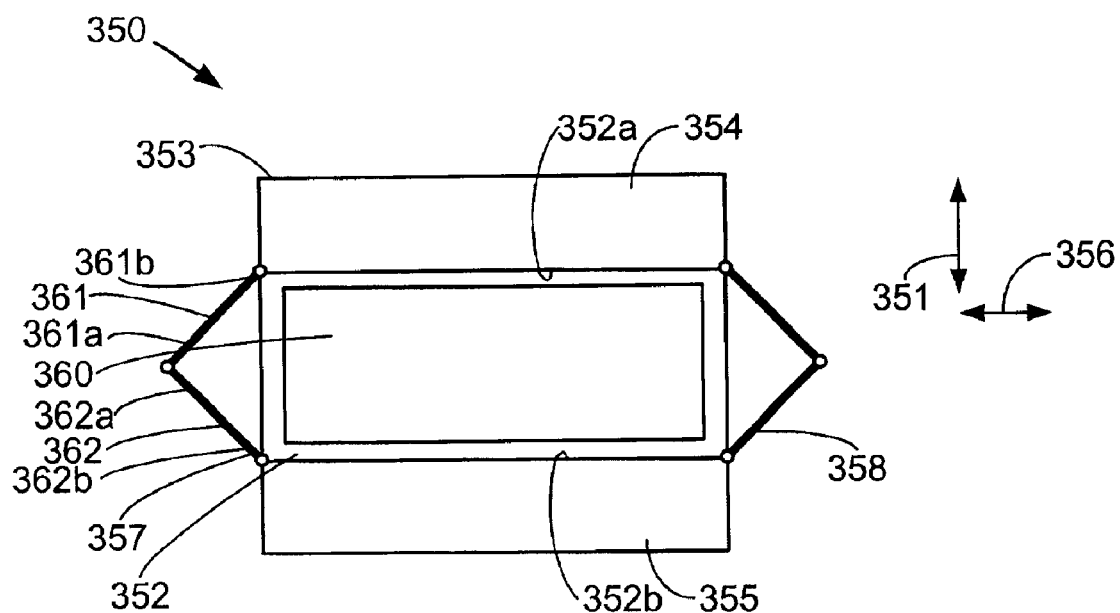
FIGS. 2G–2H illustrate a linear motion device in accordance with one embodiment of the present invention.

FIG. 2G illustrates a linear motion device 350 in accordance with one embodiment of the present invention. The device 350 is a planar mechanism having mechanical deflection in one direction 351. The device 350 comprises an electroactive polymer 352 arranged in a manner which causes a portion of the polymer to deflect in response to a change in electric field. Electrodes 360a and 360b are attached to opposite surfaces (only the foremost electrode 360a is shown) of the polymer 352 and cover a substantial portion of the polymer 352. The polymer 352 is attached to a frame 353. The frame 353 provides mechanical support and stiffness for the device 350 in all directions, linear and torsional, except a direction of output motion 359b. The frame 353 includes stiff members 354 and 355 each connected to distal ends of flexures 357 and 358.

The stiff members 354 and 355 are attached along opposite edges 352a and 352b, respectively, of the polymer 352. The stiff members 354 and 355 have a greater stiffness than the polymer 352. The added stiffness and geometric constraint provided by the stiff members 354 and 355 substantially prevents displacement in a direction 359a along the polymer length. Using only the stiff members, compliance for the device 350 remains in the direction 351 and any torsional deflection about the polymer 352.

Figure 2H:
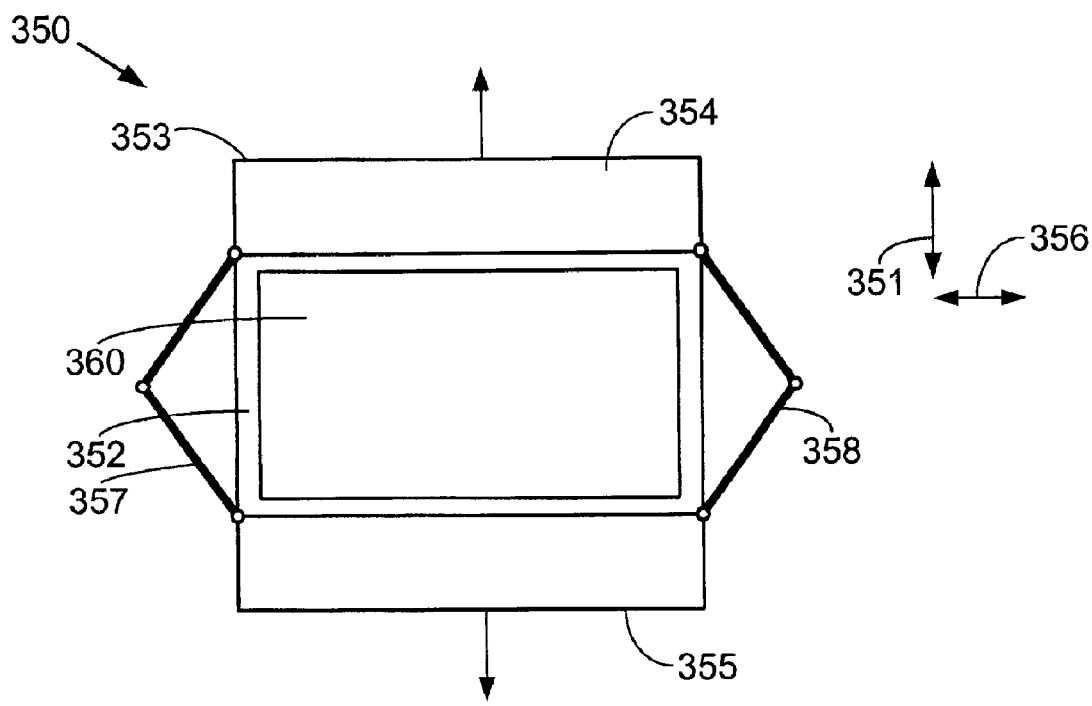
Figure 21:
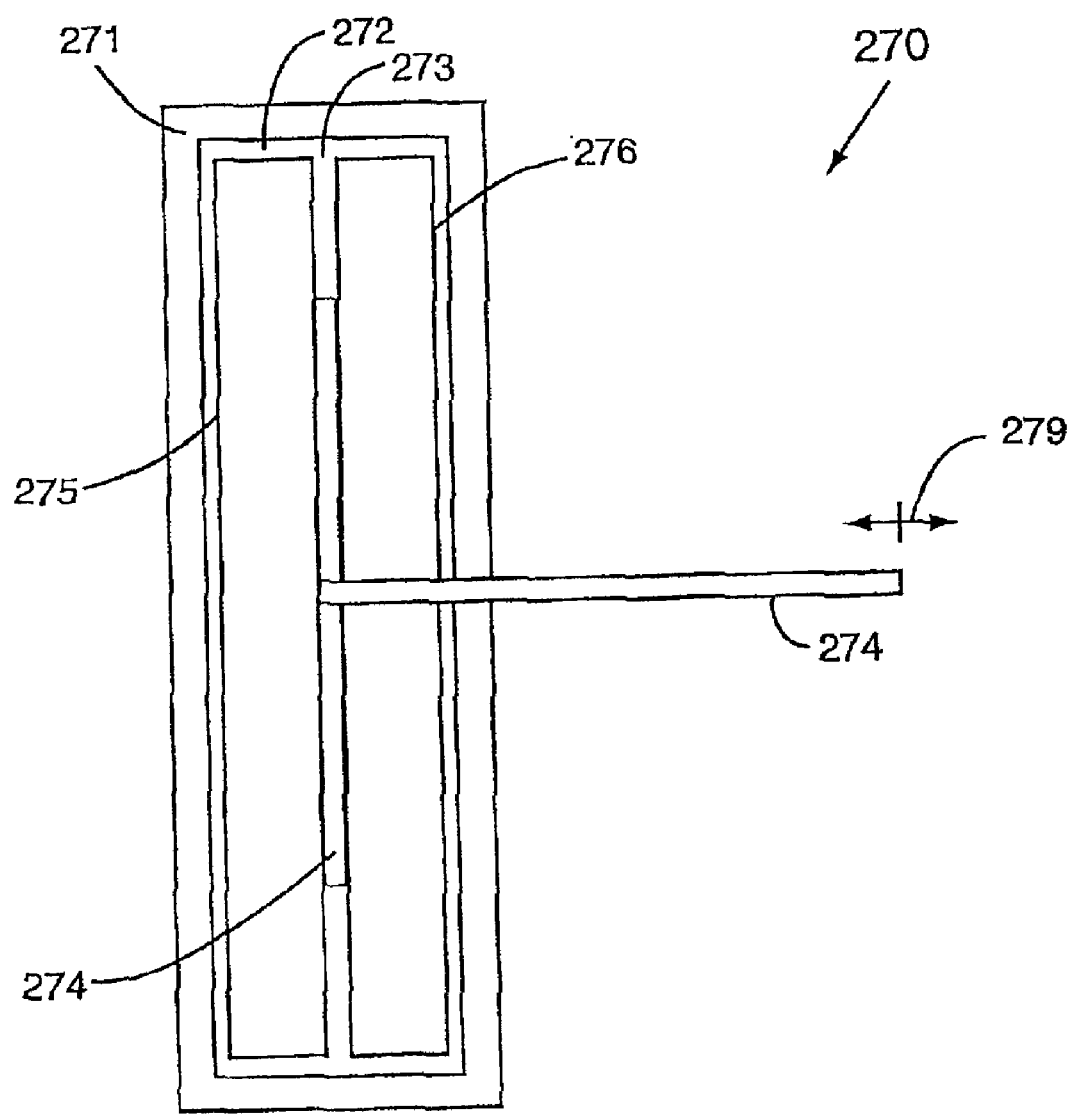

Upon actuation of the polymer 352, expansion of the polymer 352 in the direction 351 causes edges 352a and 352b and the stiff members 354 and 355 to move apart, as shown in FIG. 2H. In addition, expansion of the polymer 352 in the direction 351 causes the torsional supports 357 and 358 to straighten. Thus, deflection of the device 350 is almost exclusively in the direction 351.

Flexures 357 and 358 provide torsional stiffness for the device 350. Without flexures 357 and 358, the stiff members 354 and 355 may twist out of the plane of the polymer 352. In one embodiment, each flexure 357 and 358 is a two-bar linkage. For example, the flexure 357 comprises first and second members 361 and 362 hingeably coupled to each other at their proximate ends 361a and 362a, respectively. The first and second members 361 and 362 are also hingeably coupled to the stiff members 354 and 355 at their distal ends 361b and 362b, respectively. The first and second members 361 and 362 prevent torsion about the axis 351 but allow deflection of the device linearly in the direction 359b.

One advantage of the device 350 is that the entire structure is planar. This allows for easy mechanical coupling and simple expansion to produce multiple polymer designs. By way of example, the stiff members 354 and 355 may be mechanically coupled (e.g. glued or similarly fixed) to their respective counterparts of a second device 350 to provide two devices 350 in parallel in order to increase the force output over a single device 350. Similarly, the stiff member 354 from one device may be attached to the stiff member 355 from a second device in order to provide multiple actuators in series that increase the deflection output over a single device 350.

The constraint and shape of an electroactive polymer may affect deflection. In one embodiment, the polymer 352 has a length (along the dimension 359b) substantially greater than its width (along the dimension 359a). In a specific embodiment, the polymer has an aspect ratio at least about 4:1. In another embodiment, the device 350 is implemented with a polymer 352 having anisotropic pre-strain. For example, the polymer may include a higher pre-strain in the direction 359a than the direction 359b. As a result, the polymer 352 is stiffer in the direction 359a than the direction 359b and larger deflections in the direction 359b may result during actuation when voltage is applied to the electrodes 360.

In another embodiment, electroactive polymers suitable for use with motors of the present invention may be rolled or folded into linear transducers and actuators that deflect axially while converting from electrical energy to mechanical energy. As fabrication of electroactive polymers is often simplest with fewer numbers of layers, rolled actuators provide an efficient manner of squeezing large layers of polymer into a compact shape. Rolled or folded transducers and actuators typically include two or more layers of polymer. Rolled or folded actuators are applicable wherever linear actuators are used, such as robotic legs and fingers, high force grippers, or any of the motor designs described below.

FIG. 2I illustrates a stretched film actuator 270 suitable for use with motors of the present invention. The stretched film actuator 270 includes a rigid frame 271 having a hole 272. An electroactive polymer 273 is attached in tension to the frame 271 and spans the hole 272. A rigid bar 274 is attached to the center of the polymer 273 and provides external displacement corresponding to deflection of the polymer 273. Compliant electrode pairs 275 and 276 are patterned on both top and bottom surfaces of the polymer 273 on the left and right sides respectively of the rigid bar 274.

When the electrode pair 275 is actuated, a portion of the polymer 273 between and in the vicinity of the top and bottom electrode pair 275 expands relative to the rest of the polymer 273 and the existing tension in the remainder of the polymer 273 pulls the rigid bar 274 to move to the right. Conversely, when the electrode pair 276 is actuated, a second portion of the polymer 273 affected by the electrode pair 276 expands relative to the rest of the polymer 273 and allows the rigid bar 274 to move to the left. Alternating actuation of the electrodes 275 and 276 provides a total stroke 279 for the rigid bar 274. One variation of this actuator includes adding anisotropic pre-strain to the polymer such that the polymer has high pre-strain (and stiffness) in the direction perpendicular to the rigid bar displacement. Another variation is to eliminate one of the electrode pairs. For the benefit of simplifying the design, this variation reduces the stroke 279 for the stretched film actuator 270. In this case, the portion of the polymer no longer used by the removed electrode now responds passively like a restoring spring.

Figure 2J:
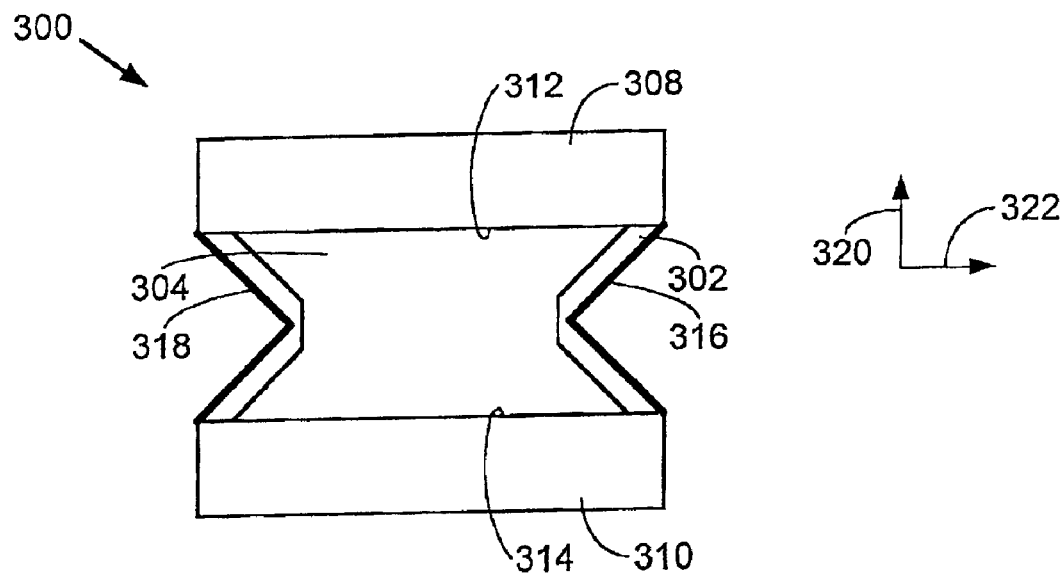
FIGS. 2J and 2K illustrate a linear actuator suitable for use with motors of the present invention.
Figure 2K:
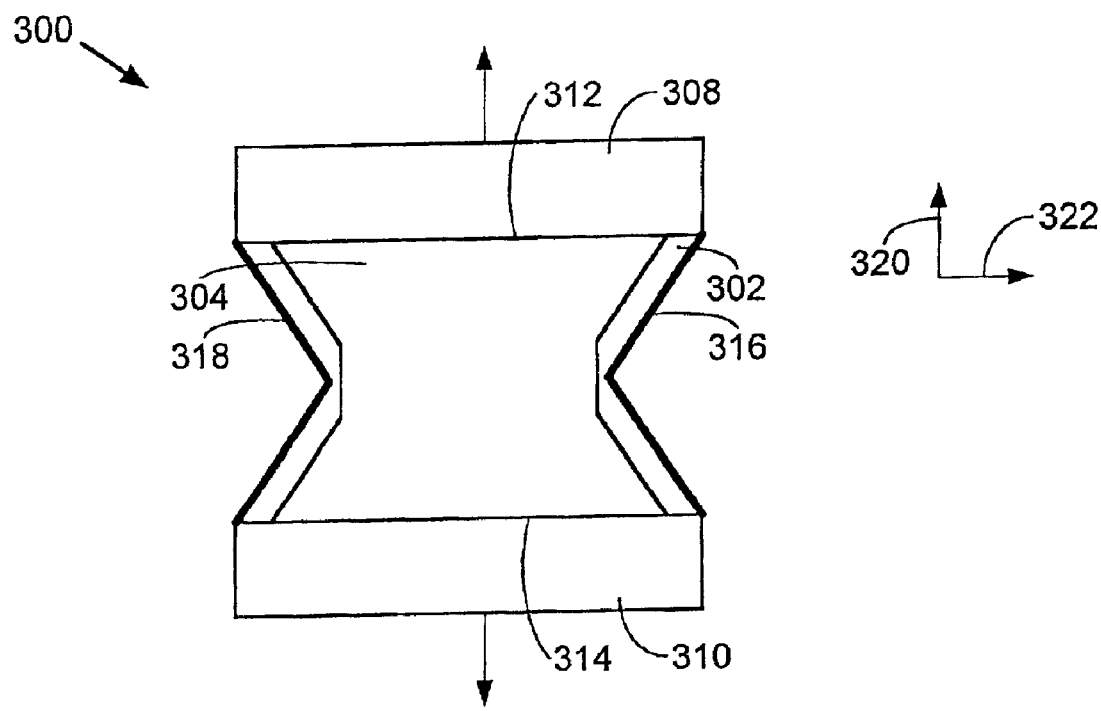

FIGS. 2J and 2K illustrate an actuator 300 suitable for use in motors of the present invention. The actuator 300 includes a polymer 302 arranged in a manner which causes a portion of the polymer to deflect in response to a change in electric field. Electrodes 304 are attached to opposite surfaces (only the foremost electrode is shown) of the polymer 302 and cover a substantial portion of the polymer 302. Two stiff members 308 and 310 extend along opposite edges 312 and 314 of the polymer 302. Flexures 316 and 318 are situated along the remaining edges of the polymer 302. The flexures 316 and 318 improve conversion from electrical energy to mechanical energy for the actuator 300.

The flexures 316 and 318 couple polymer 302 deflection in one direction into deflection in another direction. In one embodiment, each of the flexures 316 and 318 rest at an angle about 45 degrees in the plane of the polymer 302. Upon actuation of the polymer 302, expansion of the polymer 302 in the direction 320 causes the stiff members 308 and 310 to move apart, as shown in FIG. 2O. In addition, expansion of the polymer 302 in the direction 322 causes the flexures 316 and 318 to straighten, and further separates the stiff members 308 and 310. In this manner, the actuator 300 couples expansion of the polymer 302 in both planar directions 320 and 322 into mechanical output in the direction 320.

The polymer 302 is configured with different levels of pre-strain in orthogonal directions 320 and 322. This anisotropic pre-strain is arranged relative to the geometry of the flexures 316 and 318. More specifically, the polymer 302 includes a higher pre-strain in the direction 320, and little or no pre-strain in the perpendicular planar direction 322.

FIGS. 2J and 2K illustrate a linear actuator 300 suitable for use with motors of the present invention. The actuator 300 includes a polymer 302 arranged in a manner which causes a portion of the polymer to deflect in response to a change in electric field. Electrodes 304 are attached to opposite surfaces (only the foremost electrode is shown) of the polymer 302 and cover a substantial portion of the polymer 302. Two stiff members 308 and 310 extend along opposite edges 312 and 314 of the polymer 302. Flexures 316 and 318 are situated along the remaining edges of the polymer 302. The flexures 316 and 318 improve conversion from electrical energy to mechanical energy for the actuator 300.

The flexures 316 and 318 couple polymer 302 deflection in one direction into deflection in another direction. In one embodiment, each of the flexures 316 and 318 rest at an angle about 45 degrees in the plane of the polymer 302. Upon actuation of the polymer 302, expansion of the polymer 302 in the direction 320 causes the stiff members 308 and 310 to move apart, as shown in FIG. 2E. In addition, expansion of the polymer 302 in the direction 322 causes the flexures 316 and 318 to straighten, and further separates the stiff members 308 and 310. In this manner, the actuator 300 couples expansion of the polymer 302 in both planar directions 320 and 322 into mechanical output in the direction 320.

Although FIGS. 2A–2K illustrate several actuators suitable for use with motors of the present invention, other actuators including one or more electroactive polymers may also be used. Other exemplary actuators include bending beam actuators, diaphragm actuators and inchworm actuators are also suitable for use with the present invention. Additional exemplary linear and non-linear actuators suitable for use with the present invention are described in commonly owned U.S. patent application application Ser. No. 09/619,848, which was previously incorporated by reference.

5. Motor Designs

In general, a motor in accordance with the present invention comprises one or more electroactive polymers configured in a particular motor design. The design converts repeated deflection of an electroactive polymer into continuous rotation of a power shaft included in a motor. There are an abundant number of motor designs suitable for use with the present invention—including conventional motor designs retrofitted with one or more electroactive polymers and custom motor designs specially designed for electroactive polymer usage. Several motor designs suitable for use with the present invention will now be discussed. These exemplary rotary motor designs convert deflection of one or more electroactive polymers into output rotary motion.

In one aspect, a motor of the present invention comprises one or more clutches. In general, a clutch allows engagement and disengagement between a driving member and a driven member. Most commonly, the driving member is coupled to an electroactive polymer transducer and the driven member is a power shaft. When engaged, the clutch transmits deflection and power from the transducer, a portion thereof, or a structure attached thereto, to the power shaft. When disengaged, the clutch provides disconnection between the transducer and the power shaft. In other words, when the clutch is disengaged, the transducer may deflect without transferring mechanical power to the power shaft.

Figure 3A:
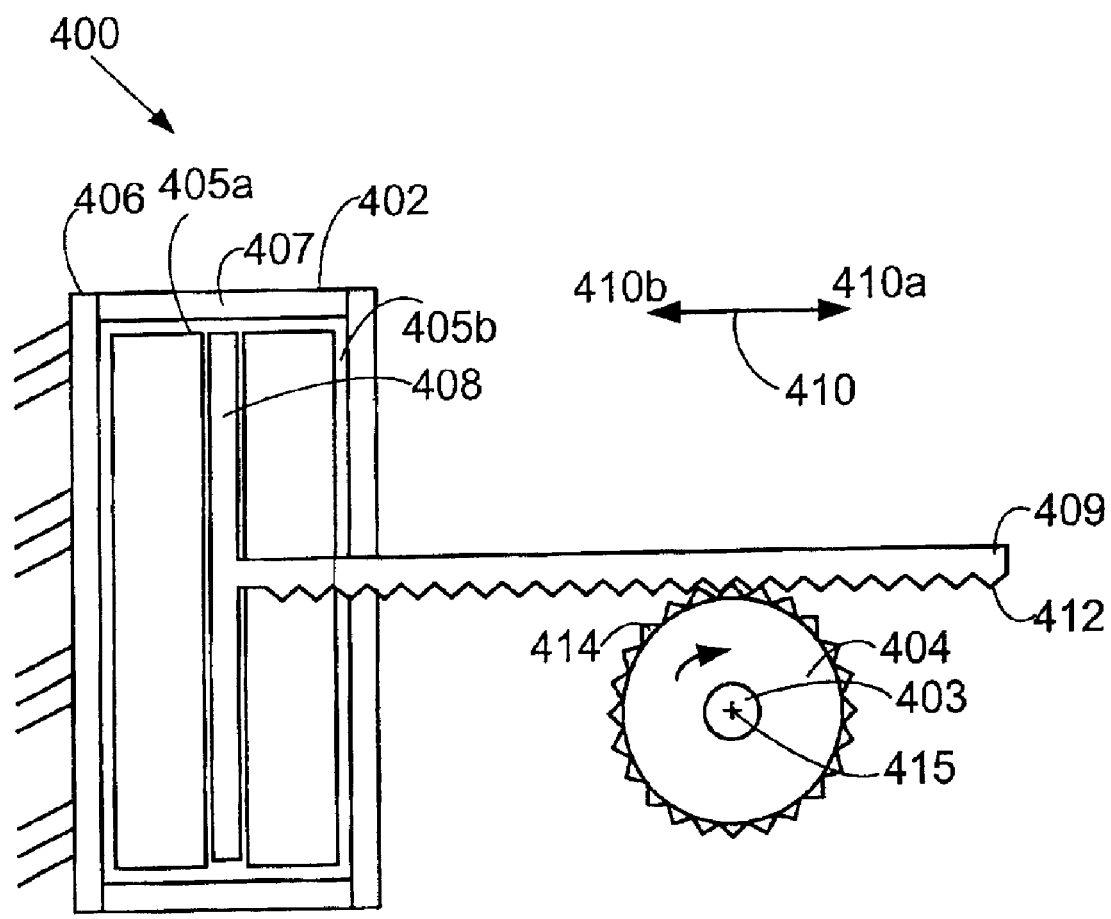
FIG. 3A illustrates a motor comprising an electroactive polymer in accordance with one embodiment of the present invention.

FIG. 3A illustrates a motor 400 comprising an electroactive polymer in accordance with one embodiment of the present invention. The motor 400 converts electrical power to mechanical power. Motor 400 includes a single transducer 402 that drives a power shaft 403 using clutch 404. Power shaft 403 is configured to rotate about axis 415, defined by bearings (not shown) that constrain the power shaft 403 in all degrees of freedom except rotation about axis 415.

Transducer 402 comprises electroactive polymer 407 and electrodes 405a and b deposited on opposing surfaces of polymer 407 (only facing electrodes 405 is shown). One edge of electroactive polymer 407 is attached to rigid member 406, which is fixed. Rigid member 408 is attached to a central portion of electroactive polymer 407 and translates in lateral direction 410. When the left portion of electroactive polymer 407 is actuated and expands using electrodes 405a, rigid member 408 deflects linearly in lateral actuation direction 410a. When electroactive polymer 407 is actuated and expands using electrodes 405b, rigid member 408 deflects linearly in lateral actuation direction 410b. Repeatedly actuating electrode pairs 405a and b in turn produces reciprocating linear deflection for rigid member 408.

Fixed to and orthogonally extending from the rigid member 408 is a rigid member 409 that includes rack 412 on one surface. Rack 412 meshes with pinion 414 circumferentially disposed on clutch 404. Together, the clutch 404, rack 412 and pinion 414 convert reciprocating linear deflection of transducer 402 into a single direction of rotation for power shaft 403. When engaged, clutch 404 transmits linear deflection in the lateral direction 410a of rigid member 409 into clockwise rotation of power shaft 403. When disengaged, clutch 404 provides disconnection between rack 412 and output shaft 403 for deflection of rigid member 409 in linear return direction 410b, thus producing no counterclockwise rotation of power shaft 403. Correspondingly, when clutch 404 is disengaged, electroactive polymer 407 elastically contracts without transferring mechanical energy to output shaft 403. A clutch suitable for use with the present invention includes p/n NRC-4 as provided by Berg, Inc. of East Rockaway, N.Y.

Since the motor 400 comprises only one clutch that rectifies transducer 402 deflection to produce clockwise rotation of power shaft 403, it derives rotary output only from lateral actuation direction 410a. Thus, there is no mechanical energy transferred to the power shaft 403 on the elastic return stroke when clutch 404 is disengaged. To capture mechanical energy produced during elastic return of the polymer, multiple clutches may be used. More specifically, a first clutch may engage the power shaft for actuation of the polymer and a second clutch engages the power shaft during elastic return of the power shaft. Multiple clutches for the same motor may be useful, for example, when viscoelastic losses in a motor are significant and any elastic energy available from elastic return of a polymer is substantially lost between actuations. Multiple clutches may also be useful when the motor is operating slowly compared to resonance of the electroactive polymer(s) included therein. In this case, even for an electroactive polymer with low losses, slow actuation of the electroactive polymer allows polymer material to lose the elastic return energy since the material will have time to make many energy-wasting vibrations between actuations.

Figure 3B:
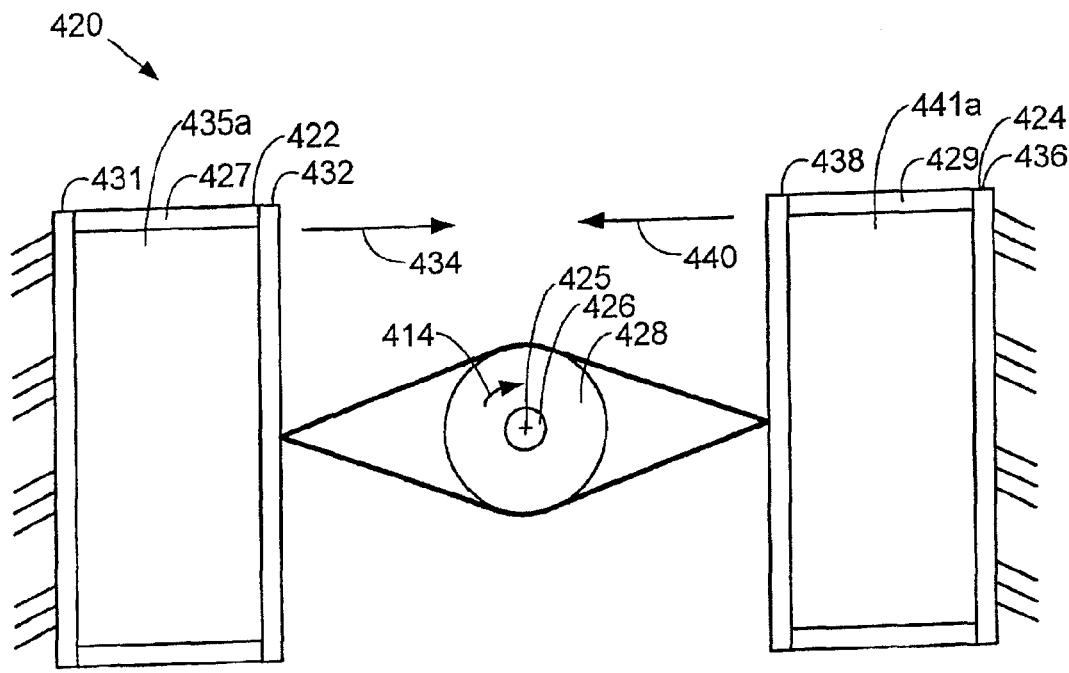
FIGS. 3B and 3C illustrate a simplified top view and side view, respectively, of a two clutch motor in accordance with another embodiment of the present invention.
Figure 3C:
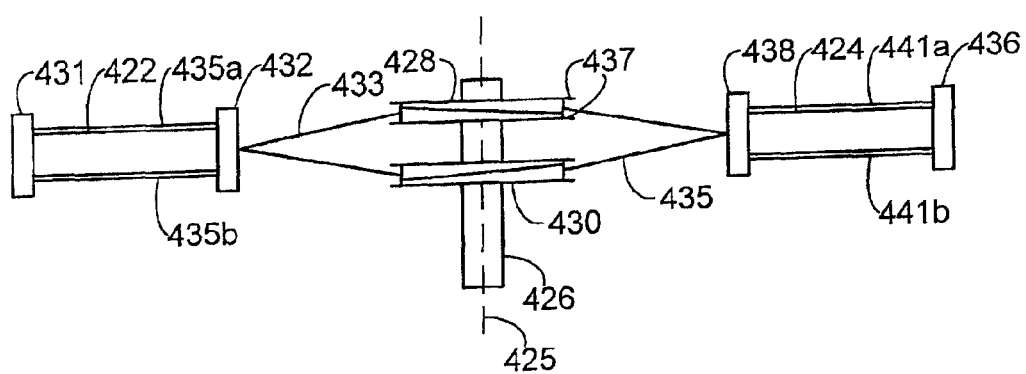

Multiple clutches are also useful in transmitting deflection and power from multiple transducers and active areas to a single power shaft, particularly when the transducers and active areas actuate out of phase from each other or have different primary directions of actuation. FIGS. 3B and 3C illustrate a simplified top view and side view, respectively, of a two clutch motor 420 in accordance with another embodiment of the present invention. The motor 420 includes two transducers 422 and 424 in tension with respect to each other that drive a motor power shaft 426 using clutches 428 and 430. Power shaft 426 rotates about a fixed axis 425. Transducer 422 comprises electroactive polymer 427 and electrodes 435a and 435b deposited on opposing surfaces of polymer 427. Transducer 424 comprises electroactive polymer 429 and electrodes 441a and 441b deposited on opposing surfaces of polymer 429. Opposite edges of transducers 422 are attached to rigid members 431 and 432, respectively. Opposite edges of electroactive polymer 424 are attached to rigid members 436 and 438. Rigid members 431 and 436 are fixed.

Transducers 422 and 424 each deflect in lateral directions 434 and 440. More specifically, when actuated using electrodes 435, rigid member 432 deflects linearly in lateral direction 434. Upon removal of the actuation voltage from electrodes 435, elastic restoring forces in the electroactive polymer 422 deflect rigid member 432 in direction 440. Similarly, when actuated using electrodes 441, rigid member 438 deflects linearly in direction 440. Upon removal of the actuation voltage from electrodes 441, elastic restoring forces in the electroactive polymer 429 deflect the rigid member 438 in lateral direction 434.

Clutches 428 and 430 convert deflection of transducers 422 and 424 into a single direction of rotation for power shaft 426. Clutches 428 and 430 are arranged such that their engagement rotates power shaft 426 in the same direction (clockwise as shown in FIG. 3B). Clutch 428 transmits linear deflection in the lateral direction 434 into clockwise rotation of power shaft 426. Clutch 430 transmits linear deflection in the lateral direction 440 into clockwise rotation of power shaft 426. Clutches 428 and 430 also allow disengagement between the power shaft 426 and the transducers 422 and 424 in the opposite direction of rotation (counterclockwise).

Cables 433 and 435 transmit linear deflection of the rigid bars 432 and 438 to the clutches 428 and 430. Cable 433 is attached to rigid bar 432, extends circumferentially around clutch 428, and is attached to the rigid bar 438. Together, clutch 428 (when engaged) and cable 433 transmit deflection in lateral direction 434 into clockwise rotation of shaft 426 for both actuation of transducer 422 and elastic contraction of polymer 429. Cable 435 is attached to rigid bar 432, extends around clutch 430, and is attached to rigid bar 438. Together, clutch 430 (when engaged) and cable 435 transmit deflection in lateral direction 440 into clockwise rotation of shaft 426 for both actuation of transducer 424 and elastic contraction of polymer 427. In one embodiment, cables 433 and 435 are fixed to the clutches 428 and 430 with suitable allowance for transducer stroke length. As shown in FIGS. 4C, cables 433 and 435 are extend circumferentially around clutches 428 and 430 and rely on friction for power transmission between the cables and power shaft 426. Cable guides 437 are included on top and bottom surfaces of clutch 428 to keep cable 433 from slipping axially from clutch 428.

As transducers 422 and 424 actuate in opposing linear directions, clutches 428 and 430 are operably coupled, via cables 433 and 435, to the output of transducers 422 and 424 such that one clutch is always engaging the output shaft 426 when one of the transducers is being actuated. Typically, transducers 422 and 424 are actuated out of phase from each other. More specifically, transducer 422 is actuated when voltage is removed from transducer 424 and transducer 424 is actuated when voltage is removed from transducer 422.

In some applications, it is important to maintain a substantially smooth and continuous output force for power shaft 426. With the two transducer motor 420 of FIG. 3B, some disruption in output force may occur when switching between actuation of the two transducers 422 and 424. For example, there may be minimal mechanical backlash in clutches 428 and 430 as well as delay in electrical switching, either of which may lead to disruption of smooth and continuous output force. In these cases, it may be desirable to include more than two electroactive polymers.

Figure 3D:
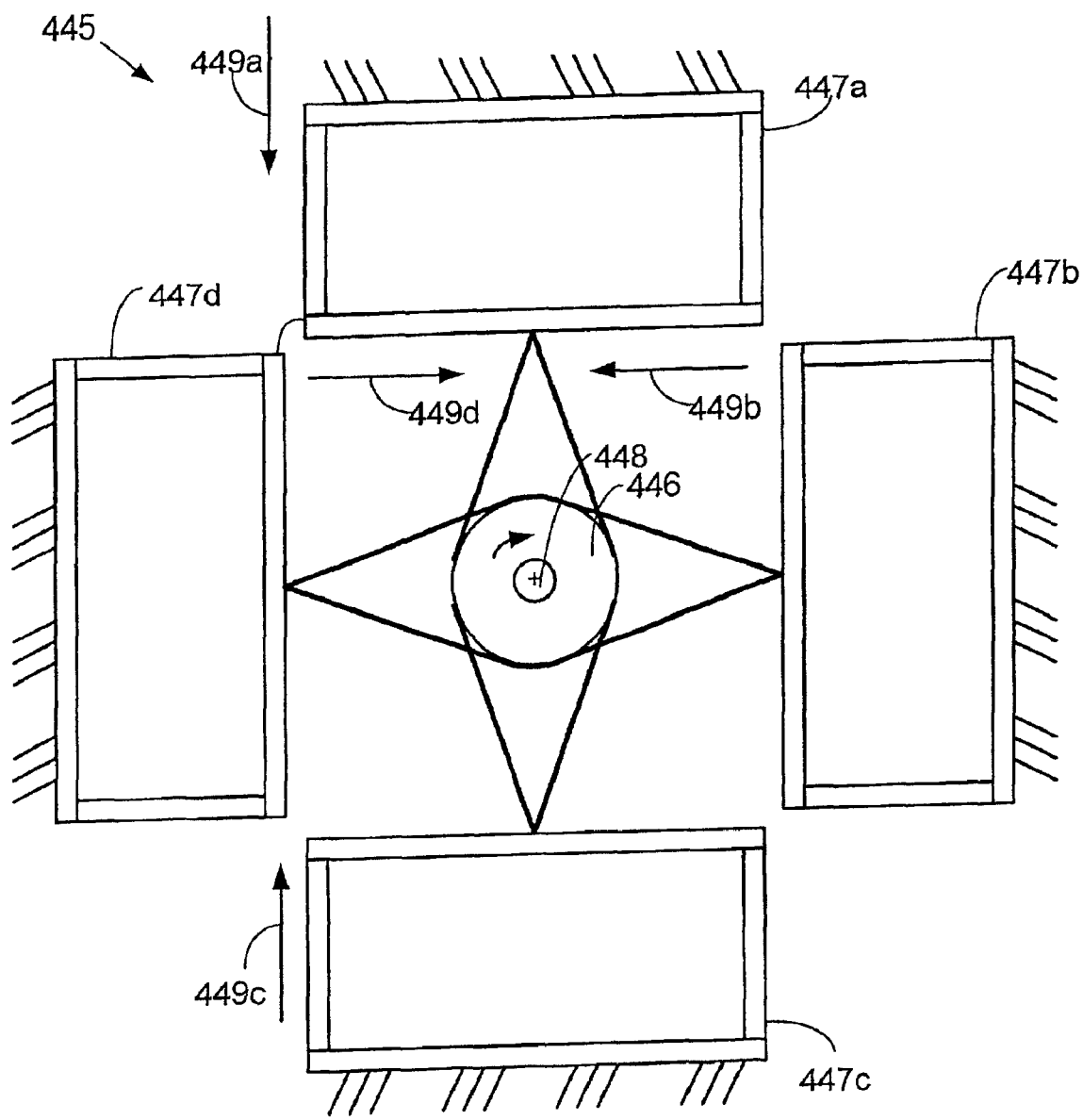
FIG. 3D illustrates a simplified top view of a multiple clutch motor including four transducers in accordance with another embodiment of the present invention.

FIG. 3D illustrates a simplified top view of a multiple clutch motor 445 including four transducers in accordance with another embodiment of the present invention. The motor 445 includes four orthogonally arranged transducers 447a–d that drive a power shaft 448 using four clutches 446 (only facing clutch 446a is shown). The four clutches 446 convert reciprocating linear deflection of transducers 447a–d into a single direction of rotation for power shaft 448. Each set of opposing transducers has a pair of clutches 446 that transmit transducer deflection in both linear directions to rotation of power shaft 448. For example, transducers 447b and 447d are coupled to a pair of clutches attached to power shaft 448 as illustrated in FIG. 3C. The pair of clutches operate similar to clutches 428 and 430 described above with respect to FIGS. 3B and 3C and are not detailed for sale of brevity. Transducers 447a–d provide actuated deflection in linear orthogonal directions 449a–d, respectively. For each transducer, removal of the actuation voltage results in elastic recovery deflection in the opposite direction as actuation.

Transducers 447a–d are sequentially fired in a timely manner to produce a smooth output force for power shaft 448. As the transducers 447a–d actuate in opposing directions, the clutches 446 are coupled such that one clutch always engages power shaft 448 when one of the transducers is being actuated. Typically, transducer 447a is actuated when voltage is removed from transducer 447c and transducer 447b is actuated when the voltage is removed from transducer 447d. The timing of transducers 447a and 447c may then be offset accordingly to produce a smooth output force for power shaft 448. In a specific embodiment, actuation of one set of opposing transducers is timed to be at peak force in actuation stroke when the other set of opposing transducers 447a–d is being electronically switched. In this manner, a smoother output force is maintained for the output shaft 448 that minimizes disruption in output force resulting from electronic switching delays to any of polymers and any mechanical backlash in the clutches 446.

Motors of the present invention may also comprise a monolithic transducer that provides power to rotate a power shaft. In this case, multiple active areas of the monolithic transducer provide independent forces for rotating the power shaft.

Figure 3E:
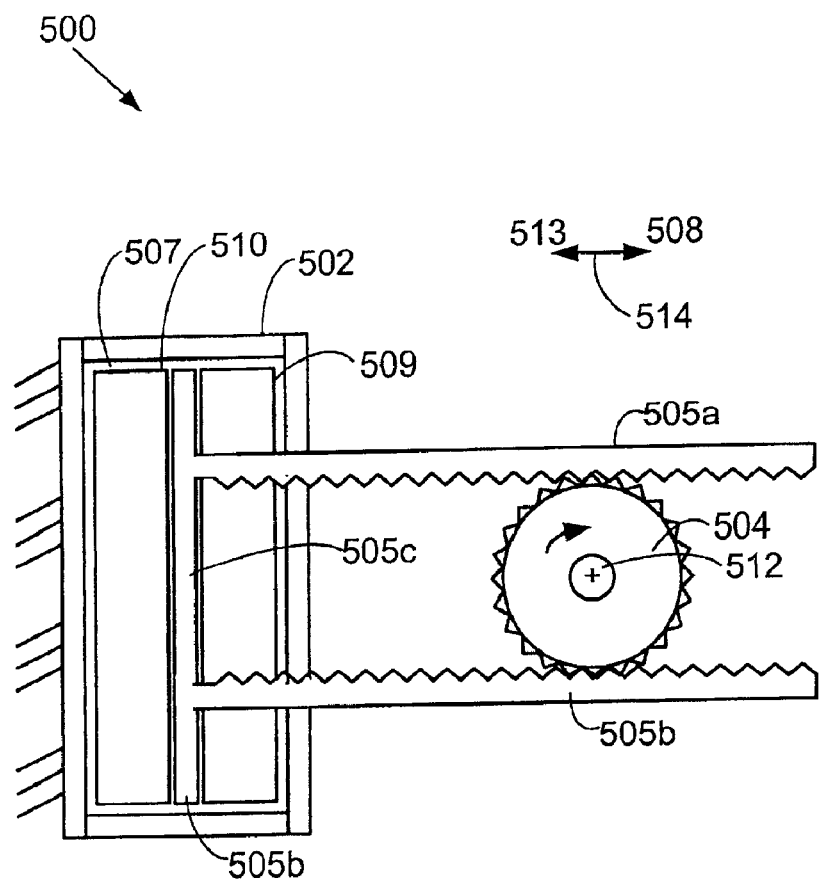
FIGS. 3E and 3F illustrate a front view and a top view, repsectively, of a motor in accordance with one embodiment of the present invention.
Figure 3F:
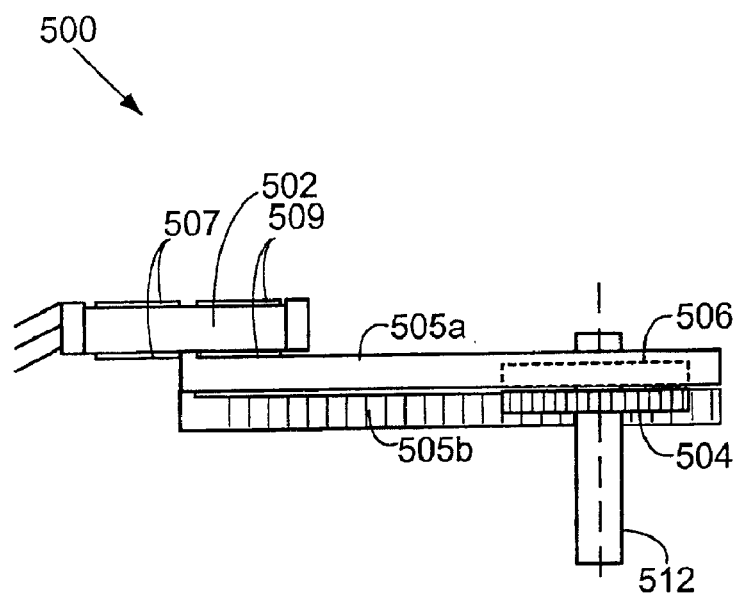

FIGS. 3E and 3F illustrate a front view and a top view, respectively, of a motor 500 in accordance with one embodiment of the present invention. Motor 500 comprises a monolithic transducer 502 similar to actuator 270 of FIG. 2I to drive a power shaft 512, using multiple clutches 504 and 506.

Translation member 505 includes a central portion 505c and rigid bars 505a and 505b that extend from central portion 505c, which is attached to the center of polymer 507. Translation member 505 provides displacement corresponding to deflection of polymer 507. Compliant electrode pairs 509 and 510 are patterned on both surfaces of polymer 507 on either side of rigid bar 505. When electrode pair 507 is actuated, translation member 505 moves in direction 508. Conversely, when electrode pair 509 is actuated, translation member 505 moves in direction 513. Alternating actuation of the electrodes 507 and 509 provides a total stroke 514 for translation member 505.

Clutch 504 transmits mechanical energy from monolithic transducer 502 to power shaft 512 in direction 508. Thus, engagement of clutch 504 produces rotation of power shaft 512 in a clockwise rotational direction for actuation using electrodes 507 and rigid bar 505a movement to the right. Clutch 506 transmits mechanical energy from monolithic transducer 502 to power shaft 512 in direction 513. Thus, engagement of clutch 506 produces rotation of power shaft 512 in same clockwise direction as clutch 504, but for an opposite direction of deflection of monolithic transducer 502 corresponding to actuation using electrodes 509 and rigid bar 505b movement to the left. Thus, clutch 504 disengages when clutch 506 engages, and vice versa.

Figure 3G:
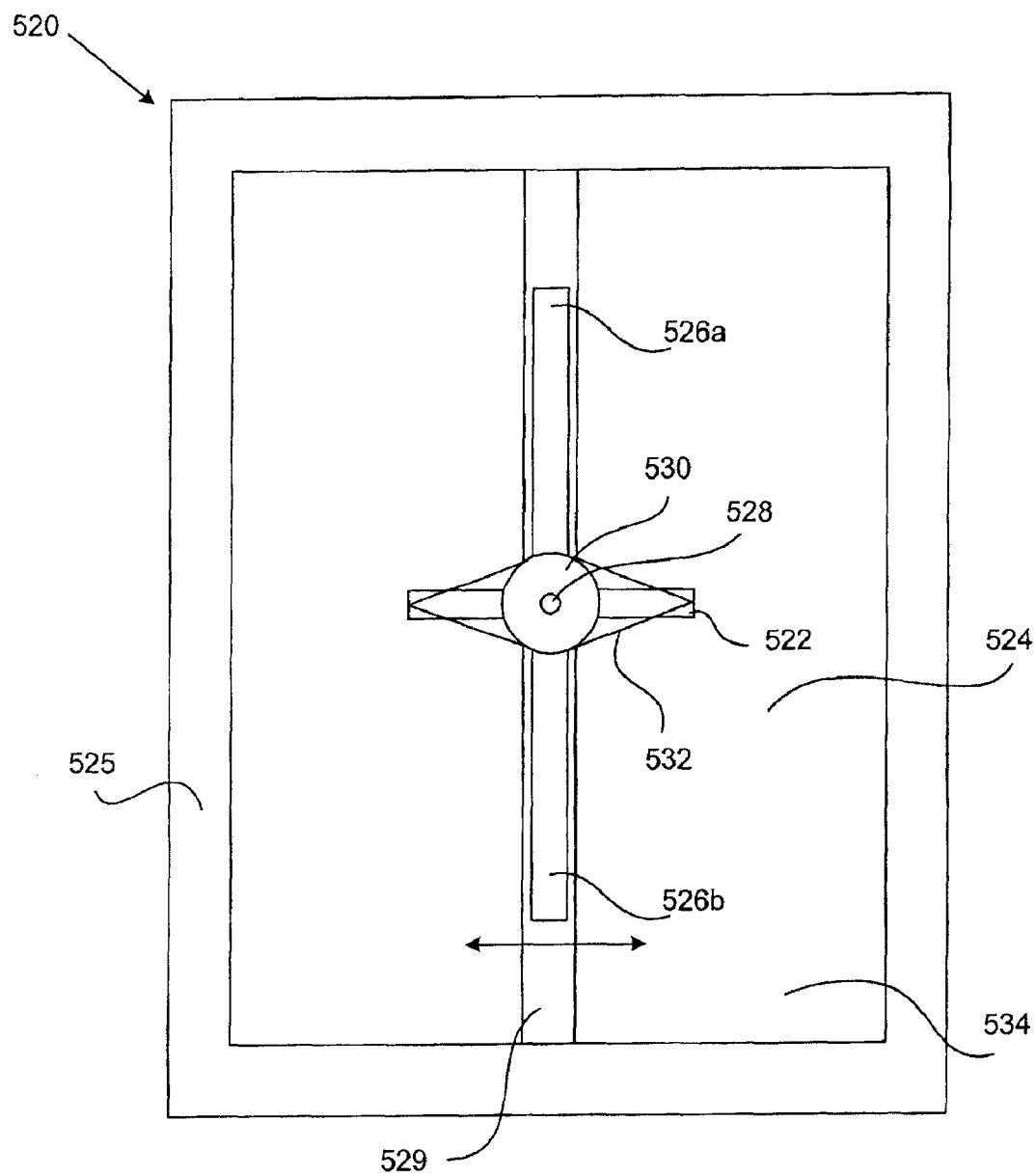
FIG. 3G illustrates a simplified front view of motor in accordance with another embodiment of the present invention.

FIG. 3G illustrates a simplified front view of motor 520 in accordance with another embodiment of the present invention. Motor 520 includes a slot 522 having rigid boundaries attached to a monolithic transducer 524 and attached to top rigid bar 526a and bottom rigid bar 526b. Each rigid bar 526 has an end attached to the polymer as shown and an end slideably coupled to the rigid boundaries of slot 522. Slot 522 allows transducer 524 to deflect laterally without interfering with power shaft 528. Transducer 524 is fixed on its perimeter to rigid frame 525, which is included in a housing that supports the components of motor 520. The housing also supports power shaft 528, fixing it laterally and allowing it to rotate freely, e.g., using suitable bearings attached to the housing.

Two clutches 530 are attached to power shaft 528 (only facing clutch 530 is shown). Cables 532 are attached to opposite sides of slot 522 and wrap around clutches 530. Together, clutches 530 and cables 532 translate power between transducer 524 and power shaft 528 for both lateral directions of transducer 524 deflection. Cables 532, clutches 530, and power shaft 528 are configured similar to the two clutch and cable system of FIGS. 3B and 3C. In this case however, the cables are attached to opposite sides of slot 522 instead of separate transducers 422 and 424. Clutches 530 are preferably located on either side of transducer 524 and positioned as close as possible to the plane of transducer 524 to prevent twisting of electoactive polymer 529 included in transducer 524.

Upon actuation of electrode pair 534, rigid bar 526 and the attached slot 522 translate laterally to the left. As rigid bar 526 translates laterally to the left, cables 532 rotate both clutches 530. One clutch engages for motion to the left and rotates power shaft 528. Similarly, as rigid bar 526 translates laterally to the right, the other clutch 530 engages and rotates power shaft 528 in the same direction.

Figure 3H:
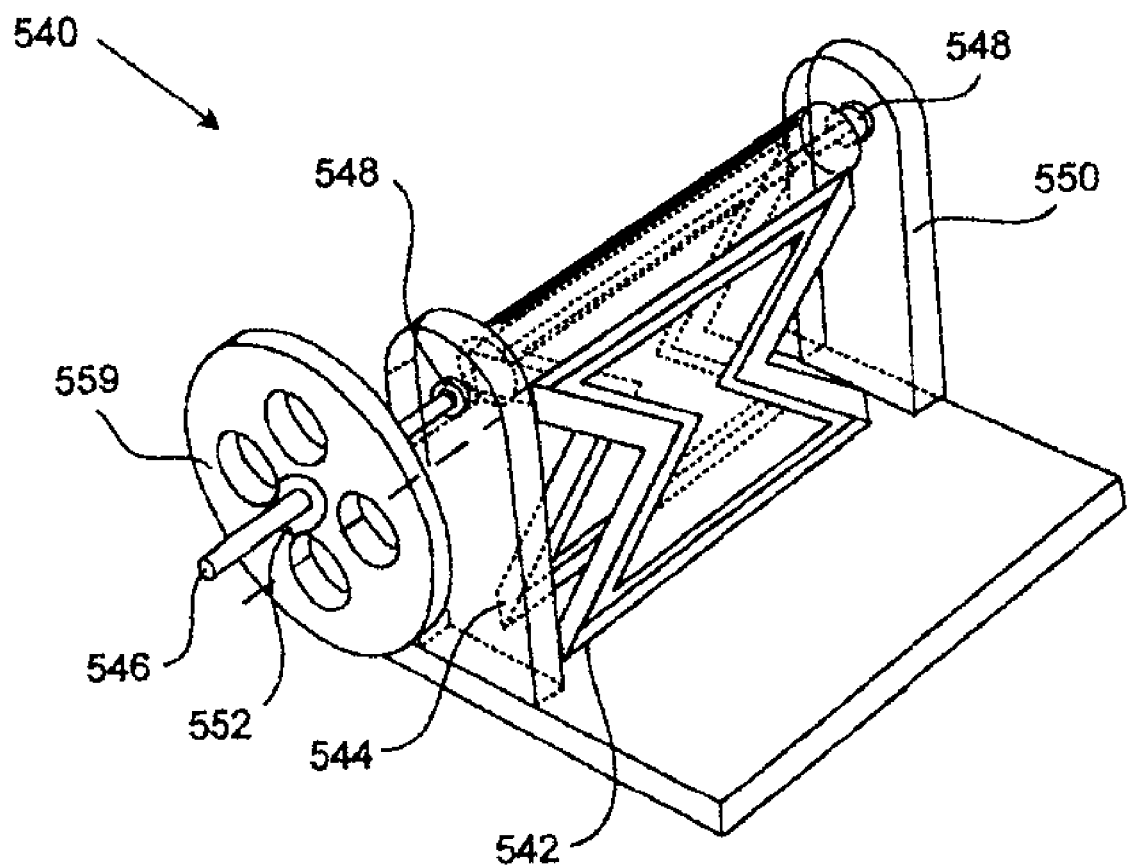
FIG. 3H illustrates a perspective view of motor in accordance with another embodiment of the present invention.

FIG. 3H illustrates a perspective view of motor 540 in accordance with another embodiment of the present invention. Motor 540 includes two actuators 542 and 544 that provide power to a power shaft 546. Actuators 542 and 544 are similar to those described in FIGS. 2J and 2K and each provide vertical linear output when actuated. Power shaft 546 is rotably supported by bearings 548 that are included in housing 550. Power shaft 546 also includes a widened portion 547 attached on opposite sides to the upper stiff members included in actuators 542 and 544. Widened portion 547 acts as a lever for actuator 542 and 544 deflection about power shaft 546.

Actuation of actuator 542 causes power shaft 546 to rotate counterclockwise. A clutch 552 engages for counterclockwise rotation of power shaft 546 and causes wheel 559 to rotate counterclockwise. When actuation of actuator 542 is finished, actuation of actuator 544 begins. Together, actuation of actuator 544 and elastic return of the electroactive polymer included in actuator 542 rotate power shaft 546 clockwise. Clutch 552 disengages for clockwise rotation of power shaft 546. In this case, wheel 559 maintains enough counterclockwise momentum from the initial rotation of power shaft 546 to keep moving during actuation of actuator 544. When actuation of actuator 544 is finished, actuation of actuator 542 begins. Together, actuation of actuator 542 and elastic return of electroactive polymer included in actuator 544 rotate power shaft 546 counterclockwise. Again, clutch 552 engages for counterclockwise rotation of shaft 546 and adds power to the counterclockwise motion of wheel 559.

To improve consistent power output of motor 540, a mechanism is used to assist output. In this case, wheel 559 acts as a flywheel. Wheel 559 stores rotational energy during power impulses of actuator 542 and releases this energy between power impulses, thus assuring less fluctuation in motor 540 power and/or speed and smoother motor operation. The size of wheel 559 will vary with the general construction and implementation of motor 540. Alternatively, wheel 559 is useful when a load attached to motor 540 is changing in force. In this case, wheel 559 helps smooth out the speed variations introduced by the load variations.

Figures 3I, 3J:
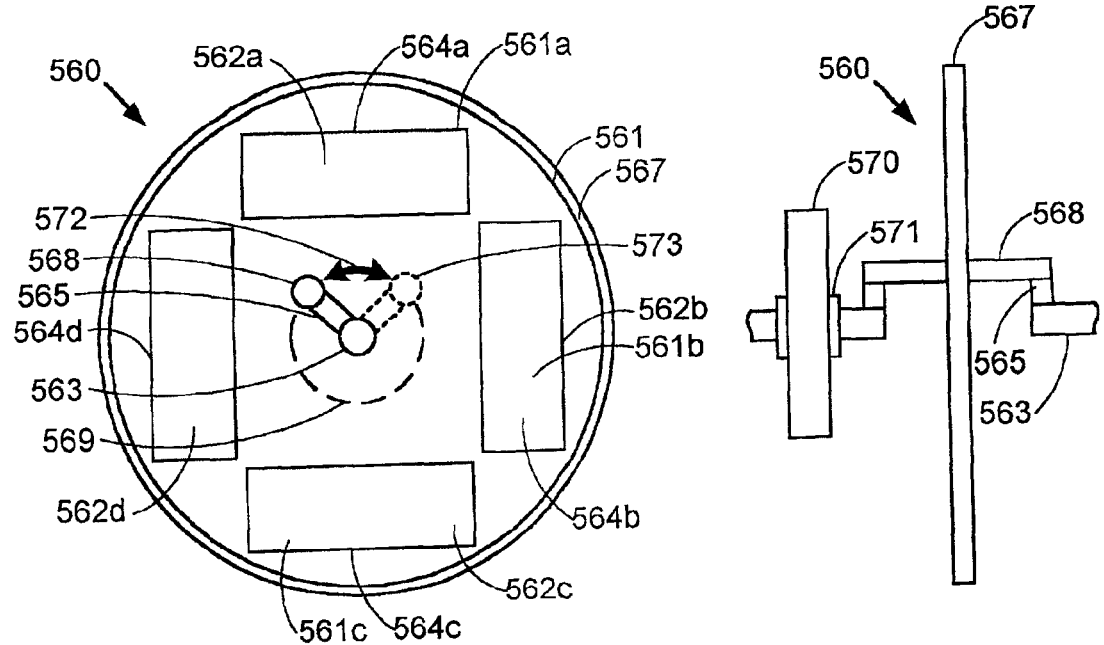
FIGS. 3I and 3J illustrate a front view and a side perspective view, respectively, of a motor comprising a plurality of active areas on a monolithic transducer in accordance with one embodiment of the present invention.

FIGS. 3I and 3J illustrate a front view and a side perspective view, respectively, of a motor 560 comprising a plurality of active areas on a monolithic transducer in accordance with one embodiment of the present invention. Motor 560 includes a monolithic transducer comprising four active areas 562a–d symmetrically arranged around a center point of the monolithic transducer. Crank pin 568 is attached to a crank arm 565 that transmits force between the crank pin 568 and power shaft 563. The monolithic transducer deflects crank pin 568 along a circular path 569, thus rotating power shaft 563. The center point of circular path 569 corresponds to the center point of the monolithic transducer as well as the center point and axis of rotation for the power shaft 563.

Each of the active areas 562a–d includes top and bottom electrodes 564a–d attached to a polymer 561 on its top and bottom surfaces respectively (only the electrodes 564a–d on the facing surface of the polymer 561 are illustrated). The electrodes 564a–d each provide a voltage difference across a portion of the polymer 561. A first active area 562a is formed with the two first active area electrodes 564a and a first portion 561a of the electroactive polymer. Similarly, a second active area 562c is formed with the two second active area electrodes 564c and a second portion of the electroactive polymer 561c. A similar arrangement applies to the active areas 562b and 562d.

The electrodes 564a–d and their corresponding active areas 562a–d are symmetrically and radially arranged the center point of circular path 569 and power shaft 563. Correspondingly, the elasticity of the active areas 562a–d is balanced about power shaft 563. As will be described below, the circular path 569 corresponds to a path of substantially constant elastic potential energy for the monolithic transducer of FIG. 3I.

A substantially rigid frame 567 is fixed to the perimeter of the circular polymer 561 using an adhesive. Crank pin 568 is attached to a central portion of polymer 561. Crank pin 568 deflection relative to the rigid frame 567 is thus guided by deflection of the central portion. Crank pin 568 thus deflects via the central portion as determined by actuation of active areas 562a–d. In some cases, the offset of the crank (the distance from the central axis of the power shaft 563 to the center of the crank pin 568) is smaller for polymers that deflect less, and can be larger for polymers that deflect more.

Actuation of the active area 562a moves crank pin 568 down. Actuation of the active area 562b moves crank pin 568 to the left. Actuation of the active area 562c moves crank pin 568 up. Actuation of the active area 562d moves crank pin 568 to the right. The active areas 562 are arranged relative to each other such that elastic energy of one active area facilitates deflection of another. The active area 562a is arranged relative to the active areas 562c such that elastic energy of the active area 562a may facilitate deflection of the active area 562c. In this case, contraction of the active area 562a at least partially facilitates expansion of the active area 562c, and vice versa. More specifically, deflection of the active area 562a includes a direction of contraction that is at least partially linearly aligned with a direction of expansion for the active area 562c towards the active area 562a. In another embodiment, the active areas 562a–d are not grouped into opposing pairs. In order for the elastic energy of one active area to facilitate the deflection of another active area, it may only be necessary for the active areas share motion in a common linear direction. In this way the polymer of transducer 560 could have two, three, five or any number of active areas arranged such that the motion of one active area shares a direction with that of another area.

Active areas 562a–d may be actuated sequentially to repeatedly move crank pin 568 along a portion 572 of the circular path 569. To achieve this, the active areas 562a–d are actuated sequentially in a timely manner. For example, crank pin 568 may begin at the position as shown in FIG. 3I. Electrical energy is then supplied to electrodes 564d while active area 562b elastically contracts; forcing crank pin 568 to rotate clockwise. After crank pin 568 rotates clockwise past its furthest position from active area 564c (a vertical position as shown), electrical energy is then supplied to electrodes 564a while active area 562c elastically contracts, thus moving crankpin 568 further clockwise.

Clockwise motion of crankpin 568 provides clockwise rotation of power shaft 563. A clutch 571 engages for clockwise rotation of power shaft 563 and transmits power from power shaft 563 to a wheel 570 for clockwise rotation of power shaft 563. Clutch 571 disengages wheel 570 from power shaft 563 for counterclockwise rotation of power shaft 563.

At the extended position 573, shown by dotted lines in FIG. 3I, active areas 562a–d stop clockwise rotation of crankpin 563 and start counterclockwise rotation thereof. More specifically, electrical energy is supplied to electrodes 564b while active area 562d elastically contracts, forcing crankpin 568 to rotate counterclockwise. After crank pin 568 rotates clockwise past its furthest position from active area 564c (a vertical position as shown), electrical energy is then supplied to electrodes 564a while active area 562c elastically contracts, thus moving crankpin 568 further counterclockwise. When the crankpin 568 reaches its starting position as shown, active areas 562a–d stop counterclockwise rotation of crankpin 563 and repeat clockwise rotation thereof.

Clockwise and counterclockwise motion of crank pin 568 along portion 572 of circular path 569 may then the repeatedly continued. Clutch 571 then rectifies this continuous motion to produce clockwise output of wheel 570. Similar to the wheel 559 of FIG. 3H, wheel 570 acts as a flywheel to maintain clockwise motion of wheel 570 between power impulses provided by active areas 562a–d, thus assuring less fluctuation in motor 540 power and/or speed and smoother motor operation.

6. Energy Features

Electroactive polymer material provides a spring force during deflection. Typically, polymer material resists deflection during actuation because of the net increase (counting active and inactive areas) in elastic energy. Removal of the actuation voltage and the induced charge causes the reverse effects. In general, when actuation voltages and any external loads are removed, electroactive polymers, or portions thereof, elastically return to their resting position. In one aspect of the present invention, elastic properties of one or more portions of an electroactive polymer, and any energy contribution of external loads, are used to assist power shaft rotation.

In one embodiment, a motor of the present invention is arranged such that deflection of a polymer in response to a change in electric field is at least partially assisted by mechanical input energy. As the term is used herein, mechanical input energy refers to mechanical energy that contributes to deflection of a portion of an electroactive polymer. The mechanical input energy provided to a portion of an electroactive polymer may include elastic energy provided by another portion of the electroactive polymer, a portion of another electroactive polymer, a spring, etc. The mechanical input energy may also include energy provided an external load or mechanism coupled to the electroactive polymer, e.g, a flywheel coupled to a power shaft. The energy may also be provided without using a separate device, for example by exploiting the rotational energy stored in the shaft or by exploiting the inertial energy of the polymer mass or connection mass(es).

Cumulatively, the sum of elastic energy in a transducer or motor at a given instant of time may be referred to as the elastic potential energy of the transducer or motor. Elastic potential energy may be used to describe transducers and motors of the present invention and methods of deflecting these transducers and motors. In one embodiment, a motor is arranged such that deflection of an electroactive polymer is substantially independent of elastic potential energy. In this case, changes in elastic energy of one or more portions of an electroactive polymer are balanced by the changes in elastic energy in the remainder of the transducer or motor. Since the deflection does not cause a substantial change in the net elastic potential energy, the deflection can be made with relatively little input electrical energy, even though the individual elastic forces internal to the transducer or motor might be relatively larger. Mechanical input energy and substantially independent elastic potential energy deflection are described in further detail in copending U.S. patent application Ser. No. 09/779,373, which is incorporated by reference for all purposes.

The motor 560 of FIG. 3I may be used to demonstrate mechanical input energy and substantially constant elastic energy deflection in accordance with one embodiment of the present invention. The motor 560 includes an equipotential line corresponding to the circular path 569 assuming the crank pin 568 is initially connected to the exact center of the film in its relaxed state, then deflected to path 569. When the active areas 562 move the crank pin 568 along circular path 569, elastic potential energy of the motor 560 is substantially independent of the position of the crank pin 568 on circular path 569. In other words, the elastic potential energy of the motor 560 remains substantially constant as the crank pin 568 moves along circular path 569. This is apparent because if the crank pin 568 is initially connected to the center of the relaxed film, then any point along circular path 569 corresponds to the same deflection of the relaxed center, just in different directions. Since the film is symmetric, the deflection of the pin 568 about the center in one direction will yield approximately the same total elastic energy as a similar deflection about the center in a different direction. The elastic energy would be exactly the same for a perfectly elastic film, but creep and other non-linear effects make the equality only approximate. As a result of this elastic energy balance, electrical input used for actuation of the motor 560 does not need to overcome elastic energy of the polymer 561 as the crank pin 568 moves along circular path 569.

In one embodiment, the crank of motor 560 is a substantially loss-less motion constraint that constrains the deflection of the crank pin 568 along circular path 569. The rigid motion constraint provides the necessary forces perpendicular to circular path 569 at any given point to offset the elastic forces in that direction.

Deflection of the motor 560 includes mechanical input energy from different portions of the polymer 561. The mechanical input energy includes elastic energy contributions provided by contractions and expansions of each of the active areas 562 and portions of the polymer 561 outside the active areas 562. A motion constraint such as crank 565 does not provide any mechanical input energy by itself, but it provides mechanical forces perpendicular to motion on an equipotential elastic energy line to assist actuation by holding the motion to a path of substantially constant elastic energy, and thereby eliminate the need for the expansion and contraction of the polymer to provide these forces. The amount of mechanical input energy and timing of actuation may vary. In one embodiment, the total mechanical input energy provided by different portions of the polymer 561 is substantially equal to the elastic energy required to deflect the first active area 562a for a part of the deflection. In another embodiment, the total mechanical input energy provided by different portions of the polymer 561 is substantially equal to the elastic energy required to deflect the first active area 562a for an entire deflection corresponding to an actuation of one of the active areas 562.

For deflection along circular path 569, the change in total elastic energy for stretching portions of the polymer 561 during actuation of one or more of the active areas 562a–d is substantially equal to the change in magnitude of the total elastic energy of contracting portions of the polymer 561. With the elastic energy balanced between the different portions of the polymer 561 along circular path 569, the mechanical output energy for motor 560 is greater for a given input voltage compared to an arrangement where the elastic energy is not balanced. In addition, an external load (e.g., the flywheel described above) coupled to crank pin 568 may also assist the crank pin 568 to provide an alternate source of energy to overcome changes in elastic energy. The flywheel can add or subtract the energy needed to make pin 568 move around circlular path 569 in spite of small changes in elastic energy, and thus reduce the amount of elastic energy that needs to be provided by electrical actuation of the polymer.

An active area may include multiple directions of contraction and expansion. Correspondingly, elastic energy generated during actuation of one active area may used to facilitate deflection of more than one other active area. For motor 560, active areas 562 are arranged relative to each other such that elastic return of one active area 562a–d may facilitate deflection of more than one other active area 562a–d in a direction of actuation. More specifically, active areas 562a and 562c are arranged such that contraction of the active area 562a may facilitate expansion of the active area 562c in a direction towards the active area 562a. In addition, active areas 562a and 562b are arranged such that contraction of the active area 562a may facilitate expansion of the active area 562b in a direction towards the active area 562a.

The timing of deflection between active areas may affect elastic energy transfer therebetween. To increase elastic energy transfer for the motor 560, the active areas 561a–d may be actuated at a high enough rate such that elastic return of one active area assists the deflection of more than one active area subsequently actuated. This may be useful for active areas having more than one direction of actuation. For example, to increase elastic energy transfer to the active areas 562b and 561c, actuation of active areas 562b and 561c may begin actuation during elastic return of active area 561a. In this manner, elastic energy generated during actuation of active area 562a is transferred to two active areas 562b and 562c actuated thereafter. A similar timing may be continuously applied as the active areas 562a–d are actuated in turn.

For the motor 560, there is a complementary nature of the active areas 562a–d on opposite sides of the crank pin 568. It should be noted that active areas and transducers for a motor need not be grouped in complementary pairs as described with the motor 560. For example, an odd number of active areas and transducers arranged around the crank pin 568 may still employ the elastic energy balance and mechanical input energy features described above. More specifically, three active areas arranged around the crank pin 568 at 120 degree intervals may still employ the elastic energy balance and mechanical input energy features described above. In this case, the expansion of one active area/transducer is paired with the contraction of more than one other active area/transducer.

7. Performance

Performance of a motor described herein may be described similar to conventional motor designs by parameters such as force output, power output, weight, efficiency, etc. The performance of motors comprising an electroactive polymer may also be described with parameters that may not be present in many conventional motor technologies.

Unlike conventional motor technologies whose power generation element provides a constant stroke, it should be noted that electroactive polymers are capable of providing varying deflection distances and stroke lengths. Thus, when coupled to a clutch and power shaft included in a motor, a transducer in accordance with the present invention is capable of varying deflection distances and stroke lengths. The transducer may then include a first deflection that rotates the power shaft a first amount corresponding to the first deflection, and a second deflection that rotates the power shaft a second amount corresponding to the second deflection. The second deflection may be greater or less than the first deflection and may be used to vary the output of the motor.

Electroactive polymer powered motors may be characterized in terms of the motor by itself or the performance of the motor in a specific application. Characterizing the performance of a motor by itself may relate to the material properties of the polymer included therein as well as the particular motor design.

As mentioned earlier with respect FIG. 1A, when a polymer expands as a result of electrostatic forces, it continues to expand until mechanical forces balance the electrostatic pressure driving the expansion. When a load is attached to a motor of the present invention, mechanical effects provided by the load will influence the force balance and deflection of the polymer—and thus influence rotation of the output power shaft. For example, if the load resists rotational deflection of the power shaft, then the electroactive transducer may not deflect as much as if were there no load. If the load is too large for the transducers driving the power shaft, the motor may stall at a stall position. Conventional electric motor technologies that rely on moving charge for electromechanical conversion still have current flowing at a stall position. When left at a stall position for extended periods of time, these conventional electric motor technologies often overheat and damage the motor. In contrast, electroactive polymer powered motors of the present invention rely on electrostatic forces and may not have current flowing at a stall position. Thus, the power shaft of a motor of the present invention may include a stall position that is maintained with substantially no electrical current to the electrodes. This advantageously avoids overheating associated with conventional electric motor motors.

The time for a polymer to rise (or fall) to its maximum (or minimum) actuation pressure is referred to as its response time. Transducers in accordance with the present invention may accommodate a wide range of response times. Depending on the size and configuration of the polymer, response times may range from about 0.01 milliseconds to 1 second, for example. A polymer excited at a high rate may also be characterized by an operational frequency. In one embodiment, maximum operational frequencies suitable for use with the present invention may be in the range of about 100 Hz to 100 kHz. Thus, motors of the present invention may have very good temporal response and control.

In one embodiment, one or more transducers included in a motor are actuated in resonant mode (e.g., the motor 400 of FIG. 3A). Operating an electroactive polymer at resonance using materials, such as silicone, with low losses (e.g., low viscoelastic losses) allows energy available from the elastic return to stay in the electroactive polymer in the form of resonant mode vibration or kinetic energy for use in a subsequent actuation. In another embodiment, a motor includes a spring that facilitates elastic return of the electroactive polymer, e.g., a spring that facilitates elastic return of electroactive polymer 407 in return direction 410b. In some cases the clutch can incorporate some amount of "slop" or the ability to free run a little in the driving direction. In this case the proportion of energy removed from each stoke is less but the amplitude and total energy of the motion is greater and therefore the total energy produced per stroke is greater.

The performance of an electroactive polymer motor as described herein may also be adapted using one or more conventional techniques. For example, a gear chain may be used to reduce the speed and increase the torque available from the motor. For applications requiring linear actuation, a rack or ball screw mechanism may convert the high torque rotary motion of an electroactive polymer motor into linear motion. For example, a small motor can be attached to lead screw to produce a slow but high-force and high-stroke linear actuator. More direct methods of linear motion may also be used. For example, a polymer linear actuator may be combined with two actuated clamps that can clamp an output shaft. One clamp is located at the "fixed" base of the linear actuator and the second is located at the moving end of the actuator. By timing the clamping action of the two clamps relative to the linear actuation of the polymer actuator, the shaft can be moved in an "inchworm-type" fashion. Similarly, a linear clutch may be used to rectify the oscillatory motion of a polymer actuator to a constant linear motion in one direction. If the clutch may be electrically engaged and disengaged, and a second such clutch is also included, then by selectively engaging the proper clutch the output shaft can be moved in either direction.

8. Applications

As the present invention includes transducers that may be implemented in both the micro and macro scales, and with a wide variety of motor designs, the present invention finds use in a broad range of applications where conversion between electrical and mechanical power is required. As one of skill in the art will appreciate, there are countless applications for motors. Broadly speaking, motors of the present invention may find use in any application requiring continuous mechanical output. These applications include robotics, pumps, animatronics, etc.

Due to the weight savings gained by using electroactive polymers in producing mechanical energy for a motor, the present invention is well-suited for applications that require a light weight motor. For example, the present invention is well-suited for applications that require a light weight motor that can operate at low speeds and yet obtain high-performance from the electroactive polymer materials. There are countless applications for a light weight, low rpm yet relatively high torque, and efficient motor. In addition, by using high speed electroactive polymers, the present invention is well-suited for applications that require a motor that can operate at high speeds and with low-torque. Further, the light weight gained by using a motor powered by an electroactive polymer allows improvements to many applications where weight of the motor is important to design. For example, remote-controlled cars that rely on one or more motors for power may require less electrical energy to power a lighter vehicle—thus allowing a smaller battery or the same battery to operate for a longer duration.

9. CONCLUSION

While this invention has been described in terms of several preferred embodiments, there are alterations, permutations, and equivalents that fall within the scope of this invention which have been omitted for brevity's sake. By way of example, although the present invention has been described in terms of several numerous applied material electrodes, the present invention is not limited to these materials and in some cases may include air as an electrode. In addition, although the exemplary mechanical-electrical power conversion systems described above were primarily described with respect to converting electrical to mechanical energy, it is understood that any of these systems may be used in the reverse direction, that is, in converting mechanical power to electrical power by oscillation the shaft though an angle. It is therefore intended that the scope of the invention should be determined with reference to the appended claims.

What is claimed is:

1. A mechanical-electrical power conversion system comprising:
   a power shaft configured to rotate about an axis;
   a transducer comprising an active area, which includes at least a portion of an electroactive polymer and at least two active area electrodes coupled to the portion of the electroactive polymer, wherein the electroactive polymer includes pre-strain; and a clutch for transmitting mechanical energy between said transducer and said power shaft, said clutch operably coupled to said power shaft and said transducer in a manner allowing engagement and disengagement of the power shaft to the transducer.

2. The system of claim 1 further comprising a rack coupled to the transducer, the rack operably meshing with a pinion attached to said clutch.

3. The system of claim 1 wherein the transducer is configured to engage the clutch during actuation of the active area and disengage the clutch during elastic return of the portion of the electroactive polymer.

4. The system of claim 1 further comprising a second transducer, the second transducer including a second electroactive polymer having a first active area, the first active area of the second electroactive polymer comprising at least two first active area electrodes coupled to the second electroactive polymer and a first portion of the second electroactive polymer.

5. The system of claim 4 wherein the first transducer is configured to rotate the power shaft while the second transducer is elastically contracting.

6. The system of claim 1 wherein the transducer is capable of a first deflection that rotates said power shaft and a second deflection that rotates said power shaft, wherein the second deflection is greater than said first deflection.

7. The system of claim 1 wherein the transducer is configured to operate in resonance.

8. The system of claim 1 further comprising a mechanism that assists rotation of the power shaft.

9. The system of claim 8 wherein the mechanism is a flywheel.

10. The system of claim 1 wherein said power shaft includes a stall position that is maintained with substantially no electrical current to said first active area electrodes.

11. The system of claim 1 wherein said transducer is included in an actuator.

12. A mechanical-electrical power conversion system comprising:
a power shaft configured to rotate about an axis;
a first transducer comprising an active area, which includes at least a portion of a first electroactive polymer and at least two active area electrodes coupled to the portion of the first electroactive polymer;
a first clutch for transmitting mechanical energy between said first transducer and said power shaft, said first clutch operably coupled to said power shaft and said first transducer in a manner allowing engagement and disengagement of said power shaft to said first transducer;
a second transducer comprising an active area, which includes at least a portion of a second electroactive polymer and at least two active area electrodes coupled to the portion of the second electroactive polymer; and
a second clutch for transmitting mechanical energy between said second transducer and said power shaft, said second clutch operably coupled to said power shaft and said second transducer in a manner allowing engagement and disengagement of said power shaft to said second transducer.

13. The system of claim 12 wherein the first transducer is configured to actuate out of phase from actuation of the second transducer.

14. The system of claim 13 wherein the first transducer is configured to rotate the power shaft while the second electroactive polymer is elastically contracting.

15. The system of claim 12 wherein the first transducer is configured to engage the first clutch while the second clutch is disengaged.

16. The system of claim 12 further comprising a rack coupled to said first transducer, the rack operably coupled to a pinion attached to said first clutch.

17. The system of claim 12 wherein said power shaft includes a stall position that is maintained with substantially no electrical current to said at least two active area electrodes coupled to the portion of the first electroactive polymer and said at least two active area electrodes coupled to the portion of the second electroactive polymer.

18. The transducer of claim 12 wherein the first electroactive polymer is elastically pre-strained.

19. The system of claim 12 further comprising a first cable coupled to the first transducer, frictionally coupled to a circumferential portion of the first clutch, and coupled to the second transducer.

20. The system of claim 19 further comprising a second cable coupled to the first transducer, frictionally coupled to a circumferential portion of the second clutch, and coupled to the second transducer.

21. The system of claim 12 wherein the first clutch and the second clutch engage said power shaft in the same direction of rotation about said axis.

22. A mechanical-electrical power conversion system comprising:
a power shaft configured to rotate about an axis;
a transducer comprising an active area, which includes at least a portion of an electroactive polymer and at least two active area electrodes coupled to the portion of the electroactive polymer;
a first clutch for transmitting mechanical energy between said transducer and said power shaft, said first clutch operably coupled to said power shaft and said transducer in a manner allowing engagement and disengagement of said power shaft to said transducer, said engagement of said first clutch producing rotation of said power shaft in a first direction about said axis for a first direction of deflection of said transducer; and
a second clutch for transmitting mechanical energy between said transducer and said power shaft, said second clutch operably coupled to said power shaft and said transducer in a manner allowing engagement and disengagement of said power shaft to said transducer, said engagement of said second clutch producing rotation of said power shaft in said first direction about said axis for a second direction of deflection of said transducer.

23. The system of claim 22 wherein said first direction of deflection of said transducer and said second direction of deflection of said transducer are linearly opposite directions.

24. The system of claim 22 wherein said transducer is a monolithic transducer comprising a second active area, the second active area having at least two second active area electrodes coupled to a second portion of the electroactive polymer.

25. The system of claim 24 wherein the first active area is configured to rotate the power shaft while the second active area is elastically contracting.

26. The system of claim 24 wherein the transducer is configured to operate in resonance.

27. The system of claim 22 wherein the transducer is capable of a first deflection that rotates said power shaft and a second deflection that rotates said power shaft, wherein the second deflection is greater than said first deflection.

28. A mechanical-electrical power conversion system comprising:

a power shaft configured to rotate about an axis;

a transducer comprising a first active area and a second active area, the first active area having at least two first active area electrodes and a first portion of the electroactive polymer arranged in a manner which causes the first portion to deflect in response to a change in electric field provided by the at least two first active area electrodes, the second active area having at least two second active area electrodes and a second portion of the electroactive polymer arranged in a manner which causes the second portion to deflect in response to a change in electric field provided by the at least two second active area electrodes; and a clutch for transmitting mechanical energy between said transducer and said power shaft, said clutch operably coupled to said power shaft and said transducer in a manner allowing engagement and disengagement of the power shaft to the transducer.

29. The system of claim 28 wherein the electroactive polymer includes pre-strain.

30. The system of claim 28 wherein the first and second active areas are arranged such that deflection of the first portion includes a direction of contraction that is at least partially linearly aligned with a direction of expansion for the second portion.

31. The system of claim 28 wherein the electroactive polymer is a dielectric elastomer.

* * * * *